(12) United States Patent
Chern

(10) Patent No.: US 11,769,846 B2
(45) Date of Patent: Sep. 26, 2023

(54) PHOTODETECTOR AND METHOD FOR FORMING THE SAME

(71) Applicant: Taiwan Semiconductor Manufacturing Company, Ltd., Hsinchu (TW)

(72) Inventor: Chan-Hong Chern, Palo Alto, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/864,725

(22) Filed: Jul. 14, 2022

(65) Prior Publication Data

US 2022/0352399 A1 Nov. 3, 2022

Related U.S. Application Data

(63) Continuation of application No. 16/994,982, filed on Aug. 17, 2020, now Pat. No. 11,393,940.

(Continued)

(51) Int. Cl.
*H01L 31/0352* (2006.01)
*H01L 31/18* (2006.01)
(Continued)

(52) U.S. Cl.
CPC ........ *H01L 31/035254* (2013.01); *H01L 31/022408* (2013.01); *H01L 31/03529* (2013.01);
(Continued)

(58) Field of Classification Search
CPC .......... H01L 31/028; H01L 31/035281; H01L 31/105; H01L 31/1804; H01L 31/035272;
(Continued)

(56) References Cited

U.S. PATENT DOCUMENTS 5,796,118 A * 8/1998 Morikawa ............. B82Y 20/00
257/466
6,075,253 A * 6/2000 Sugiyama ............. H01L 31/028
257/466
(Continued)

FOREIGN PATENT DOCUMENTS

DE 102015212208 A1 10/2016
EP 3038167 A1 6/2016
(Continued)

OTHER PUBLICATIONS

Benedikovic et al., "25 Gbps low-voltage hetero-structured silicon-germanium waveguide pin photodetectors for monolithic on-chip nanophotonic architectures," Photon. Res. 7, 437-444, (Year: 2019).
(Continued)

*Primary Examiner* — Earl N Taylor
(74) *Attorney, Agent, or Firm* — Birch, Stewart, Kolasch & Birch, LLP

(57) ABSTRACT

A photodetector is provided. The photodetector includes a bottom electrode region in a semiconductor layer, a light absorption material in the semiconductor layer, and a first buffer layer sandwiched between a bottom surface of the light absorption material and the semiconductor layer. The first buffer layer includes, from bottom to top, a first Si layer, a first SiGe layer, a second Si layer, and a second SiGe layer. A first atomic percentage of Ge in the first SiGe layer is less than a second atomic percentage of Ge in the second SiGe layer. The photodetector further includes a top electrode region over the light absorption material.

20 Claims, 20 Drawing Sheets

Related U.S. Application Data

(60) Provisional application No. 62/903,046, filed on Sep. 20, 2019.

(51) Int. Cl.
   *H01L 31/0224* (2006.01)
   *H01L 31/105* (2006.01)

(52) U.S. Cl.
   CPC .... *H01L 31/035281* (2013.01); *H01L 31/105* (2013.01); *H01L 31/1804* (2013.01)

(58) Field of Classification Search
   CPC . H01L 31/09; H01L 31/184; H01L 31/03529; H01L 21/02507; H01L 21/0251; H01L 31/035236; H01L 31/035254; H01L 31/035263; Y02P 70/50; G02F 1/01716; G02B 6/12
   See application file for complete search history.

(56) References Cited

U.S. PATENT DOCUMENTS

| | | | |
|---|---|---|---|
| 6,136,628 A * | 10/2000 | Sugiyama | H01L 31/107 438/57 |
| 6,307,242 B1 * | 10/2001 | Sugiyama | H01L 31/028 257/E31.011 |
| 6,943,409 B1 * | 9/2005 | Cheng | B82Y 20/00 257/466 |
| 7,397,101 B1 * | 7/2008 | Masini | G02B 6/4295 257/656 |
| 9,437,759 B2 * | 9/2016 | Baehr-Jones | H01L 27/14649 |
| 9,553,222 B2 | 1/2017 | Baehr-Jones et al. | |
| 9,812,598 B2 | 11/2017 | Baehr-Jones et al. | |
| 9,905,600 B1 * | 2/2018 | Cheng | H01L 27/14685 |
| 10,043,927 B2 | 8/2018 | Baehr-Jones et al. | |
| 10,121,927 B2 * | 11/2018 | Nakayama | H01L 31/02005 |
| 10,134,938 B2 * | 11/2018 | Novack | H01L 31/02327 |
| 10,158,036 B2 | 12/2018 | Usami | |
| 10,901,150 B2 | 1/2021 | Novack et al. | |
| 2010/0006961 A1 * | 1/2010 | Yasaitis | H01L 31/18 257/431 |
| 2010/0078680 A1 | 4/2010 | Cheng et al. | |
| 2011/0012221 A1 * | 1/2011 | Fujikata | H01L 31/022408 257/458 |
| 2011/0037133 A1 * | 2/2011 | Su | H01L 31/1808 257/E31.127 |
| 2015/0016769 A1 * | 1/2015 | Verma | G02B 6/12004 438/69 |
| 2015/0028286 A1 * | 1/2015 | Vu | H01L 27/1446 117/90 |
| 2015/0279894 A1 | 10/2015 | Cheng et al. | |
| 2016/0111285 A1 | 4/2016 | Lochtefeld et al. | |
| 2017/0012143 A1 * | 1/2017 | Usami | H01L 31/105 |
| 2017/0018457 A1 * | 1/2017 | Schulze | H01L 21/76841 |
| 2017/0179316 A1 * | 6/2017 | Balakrishnan | H01L 31/035254 |
| 2017/0317221 A1 * | 11/2017 | Usami | H01L 31/035281 |
| 2018/0219114 A1 * | 8/2018 | Balasekaran | H01L 31/0304 |
| 2019/0280146 A1 * | 9/2019 | Baudot | H01L 31/105 |
| 2019/0378949 A1 * | 12/2019 | Simoyama | H01L 31/105 |
| 2020/0313021 A1 * | 10/2020 | Fujikata | H01L 31/035281 |
| 2020/0393618 A1 * | 12/2020 | Novack | H01L 31/02327 |
| 2021/0066535 A1 * | 3/2021 | Ludurczak | H01L 31/1808 |
| 2021/0074814 A1 * | 3/2021 | Stephenson | H01L 23/485 |
| 2021/0091239 A1 * | 3/2021 | Chern | H01L 31/035281 |
| 2021/0091245 A1 * | 3/2021 | Chern | H01L 31/1804 |
| 2021/0091246 A1 * | 3/2021 | Chern | H01L 31/022408 |

FOREIGN PATENT DOCUMENTS

| | | |
|---|---|---|
| EP | 3462232 A1 | 4/2019 |
| JP | H10163515 A | 6/1998 |
| JP | 2014183195 A | 9/2014 |
| KP | 20090062483 A | 6/2009 |
| WO | WO 2015187929 A2 | 12/2015 |

OTHER PUBLICATIONS

Chen, "Advanced Germanium P-i-n and Avalanche Photodetectors for Low-Power Optical Interconnects," Ghent University, Faculty of Engineering and Architecture, 186 pages, (Year: 2016).

Virot et al., "Integrated waveguide PIN photodiodes exploiting lateral Si/Ge/Si heterojunction," Opt. Express 25, 19487-19496, (Year: 2017).

* cited by examiner

PHOTODETECTOR AND METHOD FOR FORMING THE SAME

PRIORITY CLAIM

This application is a Continuation Application of U.S. application Ser. No. 16/994,982, filed on Aug. 17, 2020, entitled "PHOTODETECTOR AND METHOD FOR FORMING THE SAME," which claims the benefit of U.S. Provisional Application No. 62/903,046, filed on Sep. 20, 2019 and entitled "Photodetector and method for forming the same," all of which are incorporated herein by reference.

BACKGROUND

There is a constant drive within the semiconductor industry to reduce costs and increase the performance of such semiconductor devices as photodetectors, diodes, light-emitting diodes, transistors, latches, and many others. This drive has resulted in continuing demand for integrating one type of semiconductor device into another semiconductor process.

For example, in photodetectors that are comprised of an array of p-n junctions or p-i-n structures, it is advantageous to make the p-n junctions and/or p-i-n structures out of low band-gap materials, such as germanium (Ge) and InGaAs, because the photodetectors are able to detect infrared light. In the interests of cost-efficiency, it is preferable to produce a thin film of III-V or other non-silicon materials on low-cost large-size silicon wafers to reduce the cost of high-performance III-V devices. It is further desired to integrate non-silicon p-n junctions and/or p-i-n structures (e.g. Ge or InGaAs based) into a silicon process so that other circuitry in the system, such as a photodetector, can be fabricated using a standard silicon process, such as a standard CMOS (complementary-metal-oxide-semiconductor) process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1O-1 is an enlarged view of area B shown in FIG. 1O, in accordance with some embodiments of the disclosure.

DETAILED DESCRIPTION

Figure 1A:
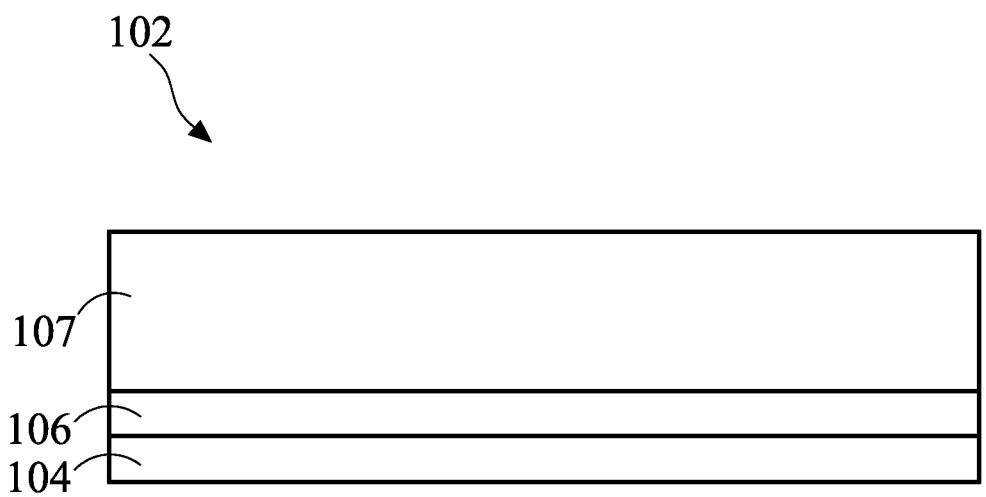
FIGS. 1A through 1V are cross-sectional views illustrating the formation of a photodetector at various intermediate stages, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Wavelengths of 1310 nm and 1550 nm generally are applied in data-communication and telecommunication, respectively. To convert a light signal to an electrical signal for data- and telecommunication applications, a photodetector needs to be able to efficiently absorb the light signal within the wavelength of about 1200 nm to about 1600 nm. For silicon photonic devices (i.e., including photonic components made of silicon and integrated on a silicon substrate), such as optical transceiver, photodetectors, optical modulators, grating couplers, light-emitting diodes, and/or the like, a silicon waveguide is able to confine and connect infrared light (wavelength greater than about 700 nm) due to its strong refractive index (about 3.47) in contrast to its silicon oxide cladding layers (about 1.45). Germanium and/or silicon germanium are easy to integrate with silicon photonic devices on the same silicon substrate (wafer) so that the application of the germanium and/or silicon germanium in photonic devices may significantly reduce overall manufacturing cost of photonic devices.

The aspect of the embodiments of the present disclosure is direct to a photodetector and a method for forming the photodetector. The photodetector may include a semiconductor layer, a superlattice structure in the semiconductor layer, and a light absorption material above the first superlattice structure. The superlattice structure includes pairs of silicon layer/silicon germanium layer, which may mitigate or eliminate misfit dislocations between the semiconductor layer and the light absorption material, thereby reducing the likelihood of the formation of crystalline defects in the light absorption material. Therefore, the performance of the photodetector may be enhanced, e.g., lower dark current, lower signal-to-noise ratios, and/or higher responsivity.

Figure 1B:
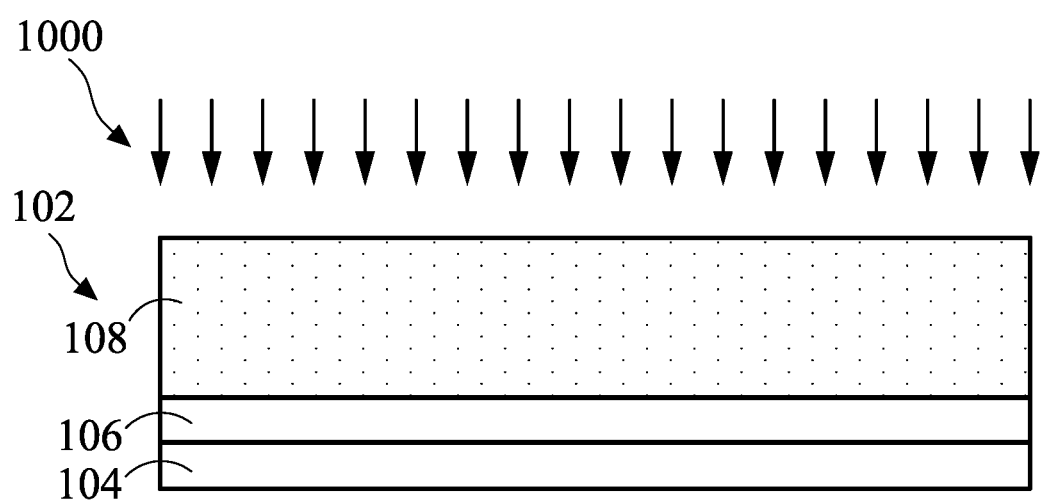
Figure 1C:
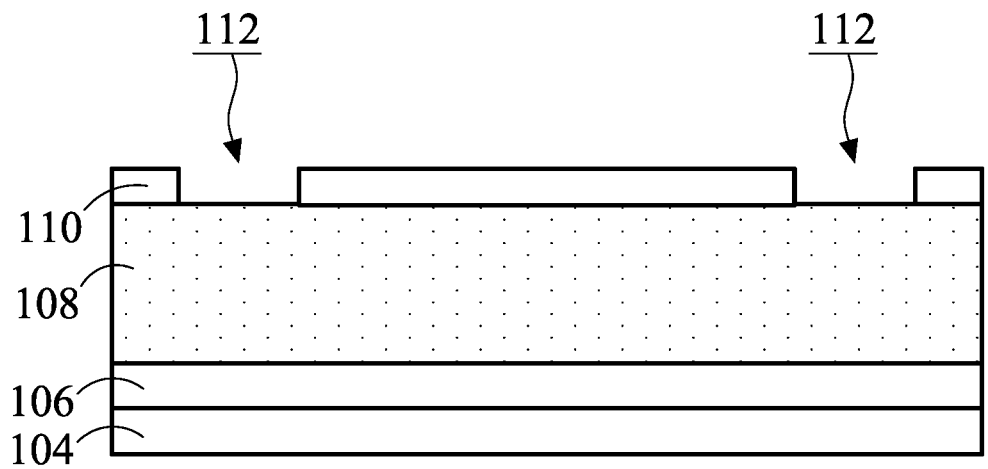
Figure 1D:
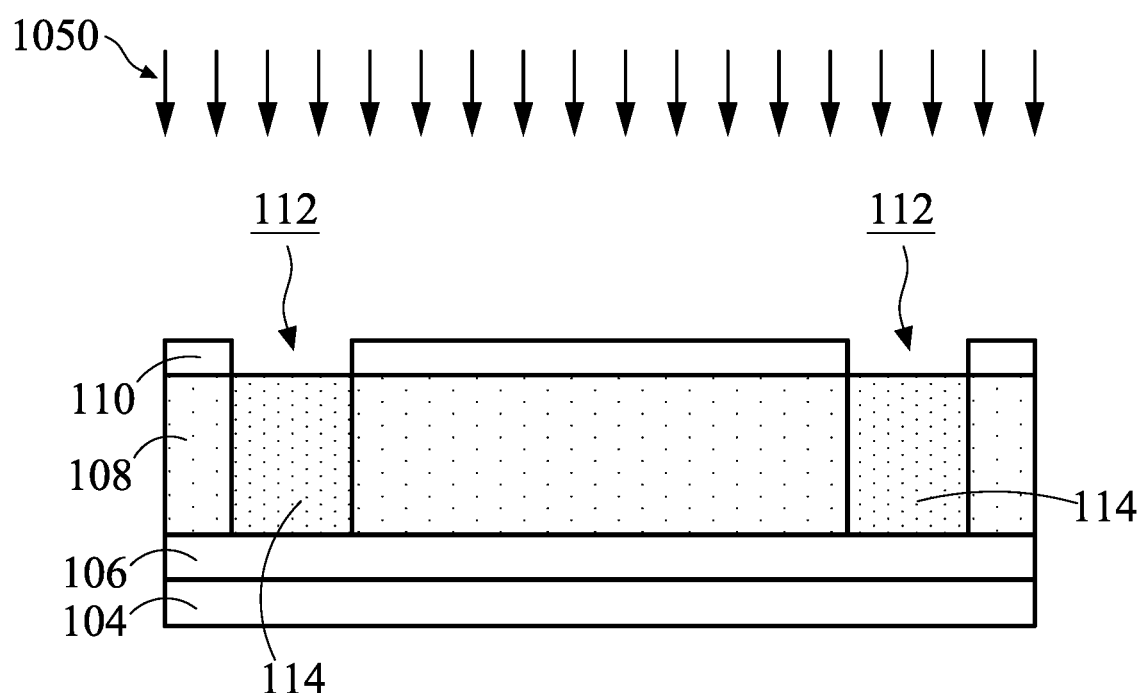
Figure 1E:
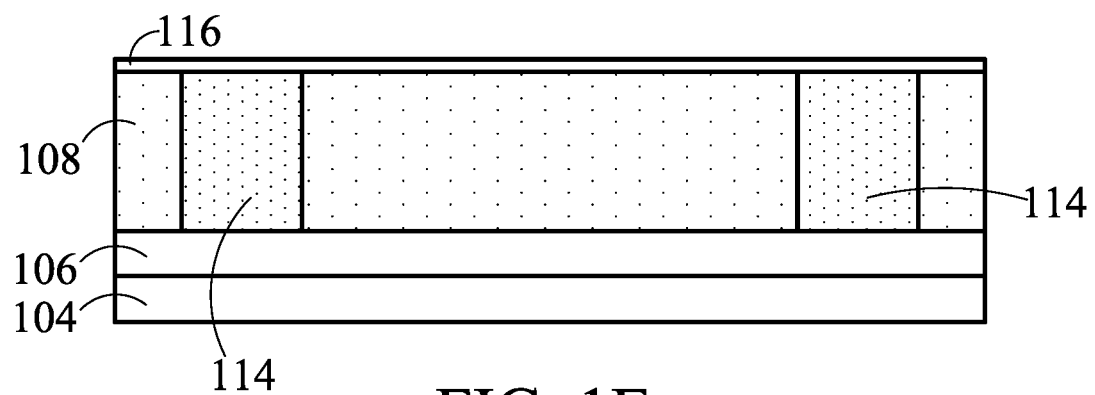
Figure 1F:
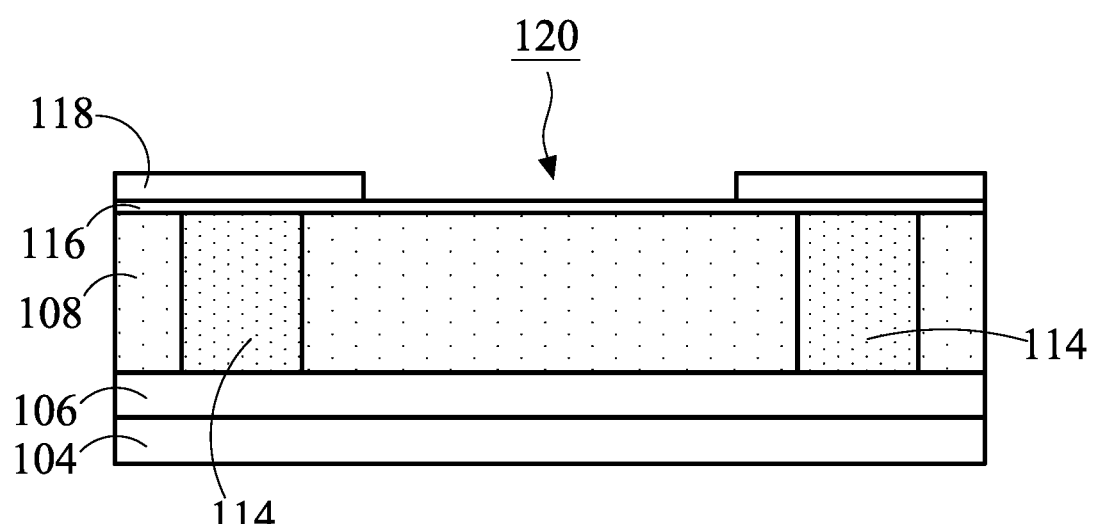
Figure 1G:
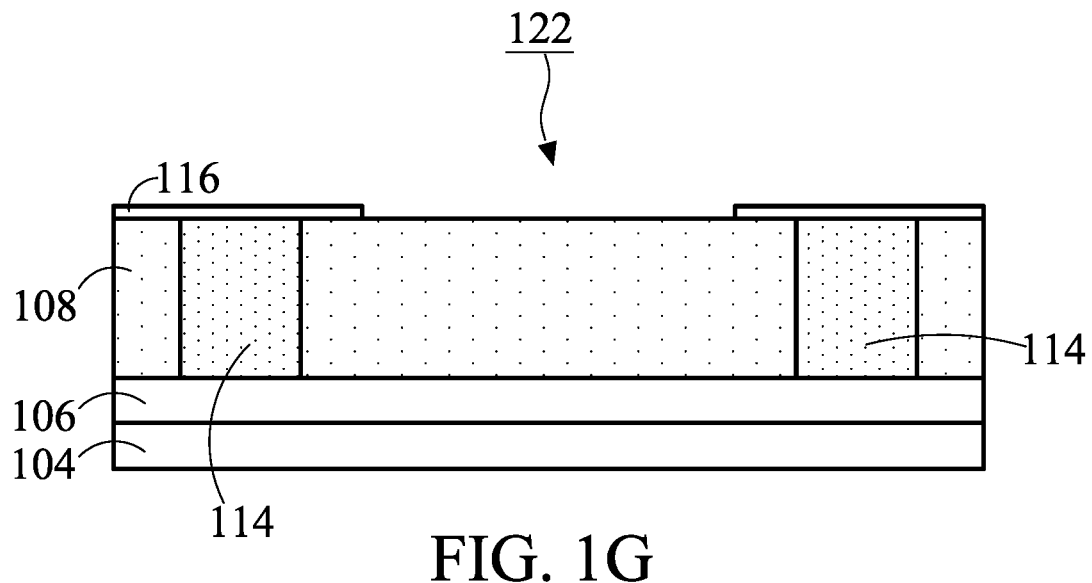
Figure 1H:
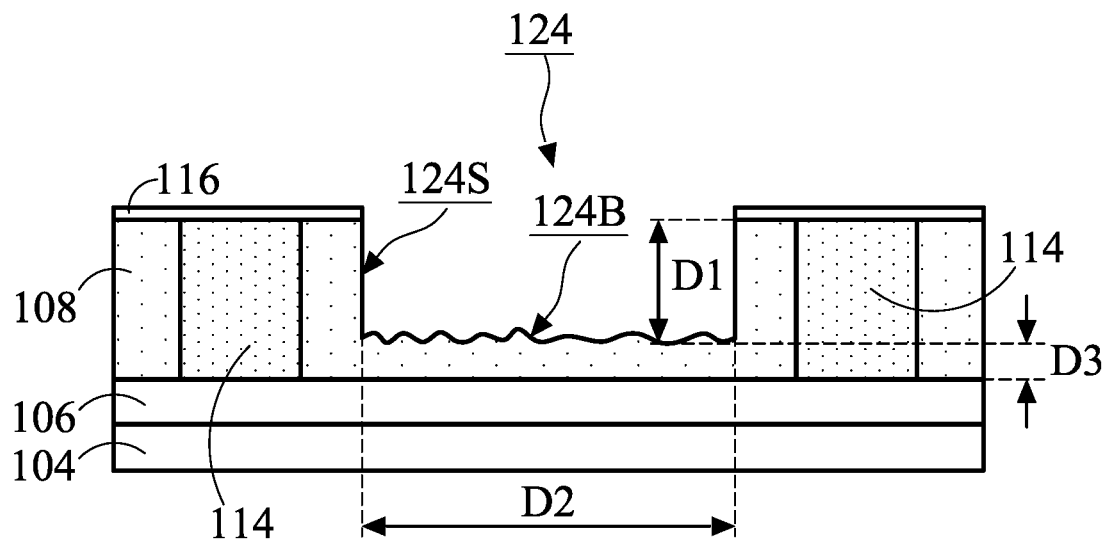
Figure 1I:
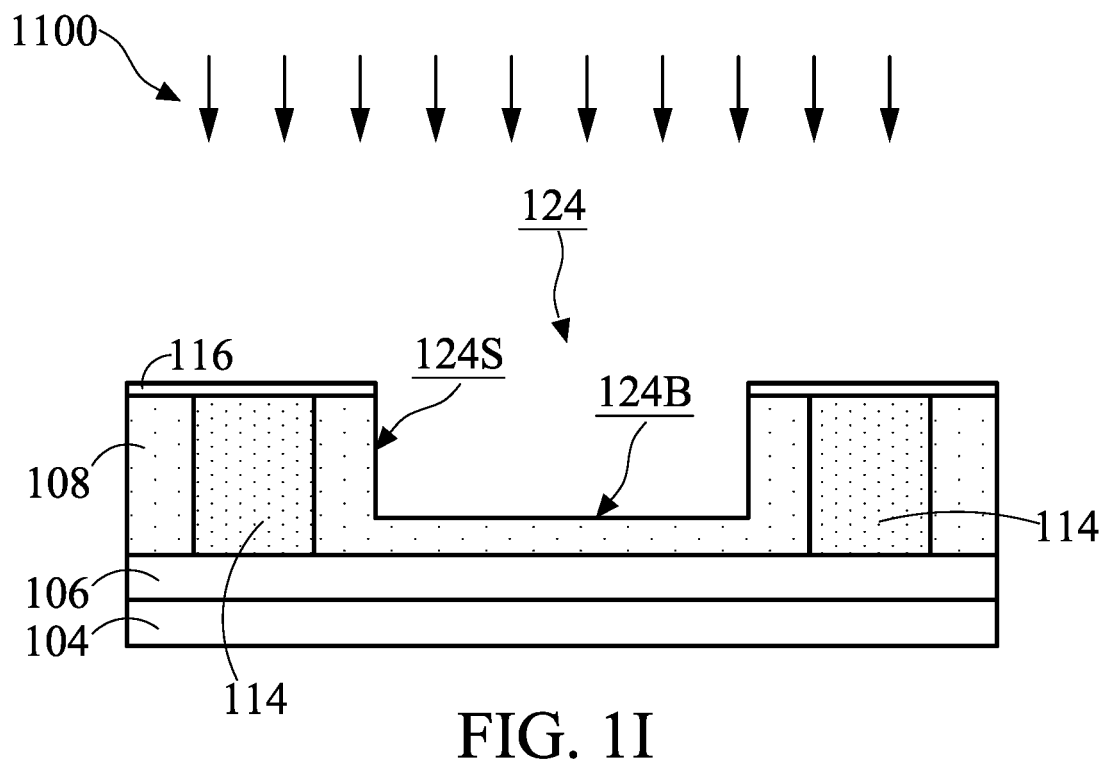
Figure 1J:
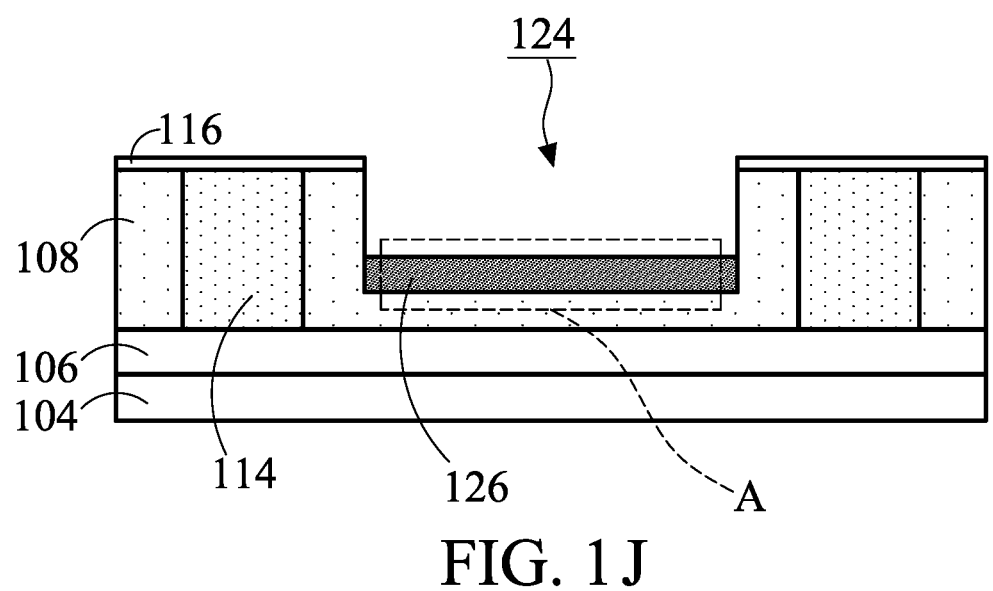
FIG. 1J-1 is an enlarged view of area A shown in FIG. 1J, in accordance with some embodiments of the disclosure.
Figures 1, 1J:
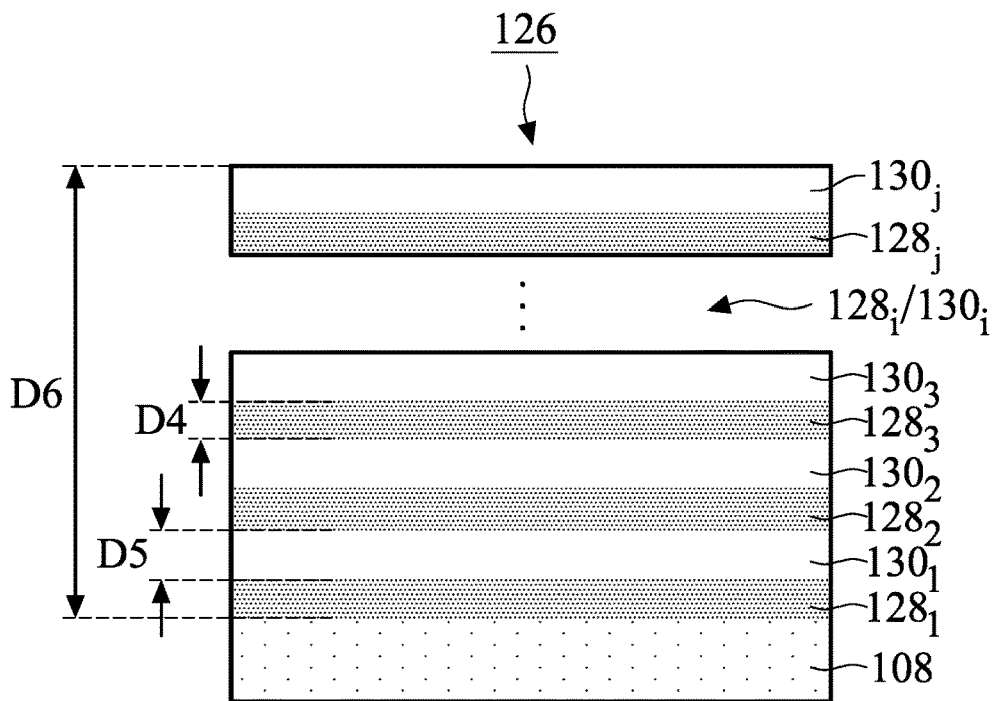
Figure 1K:
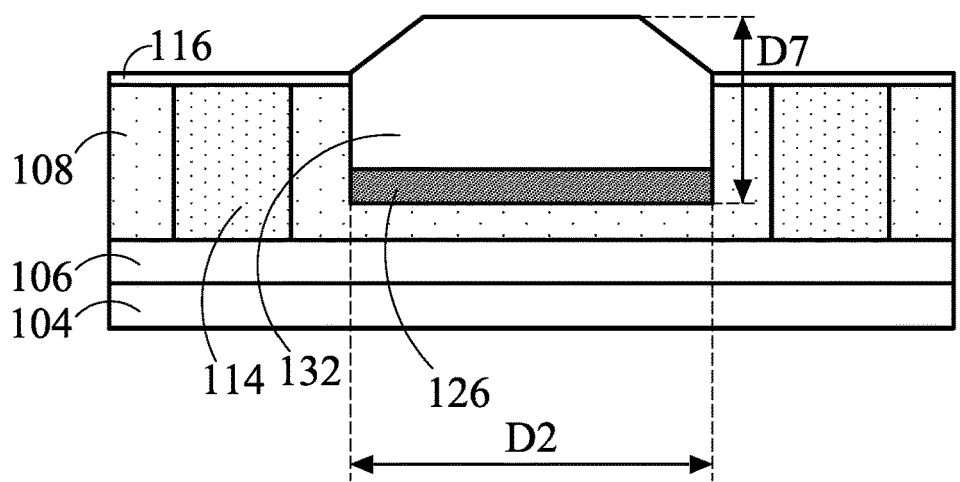
Figure 1L:
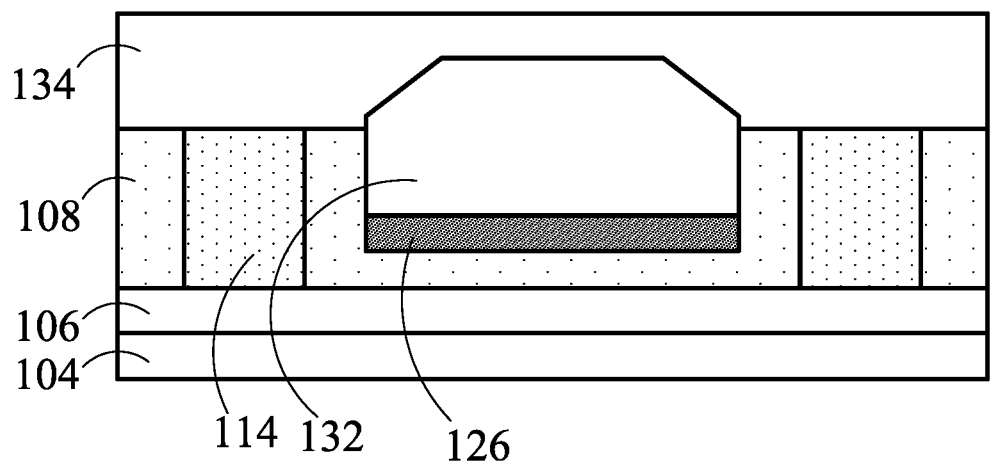
Figure 1M:
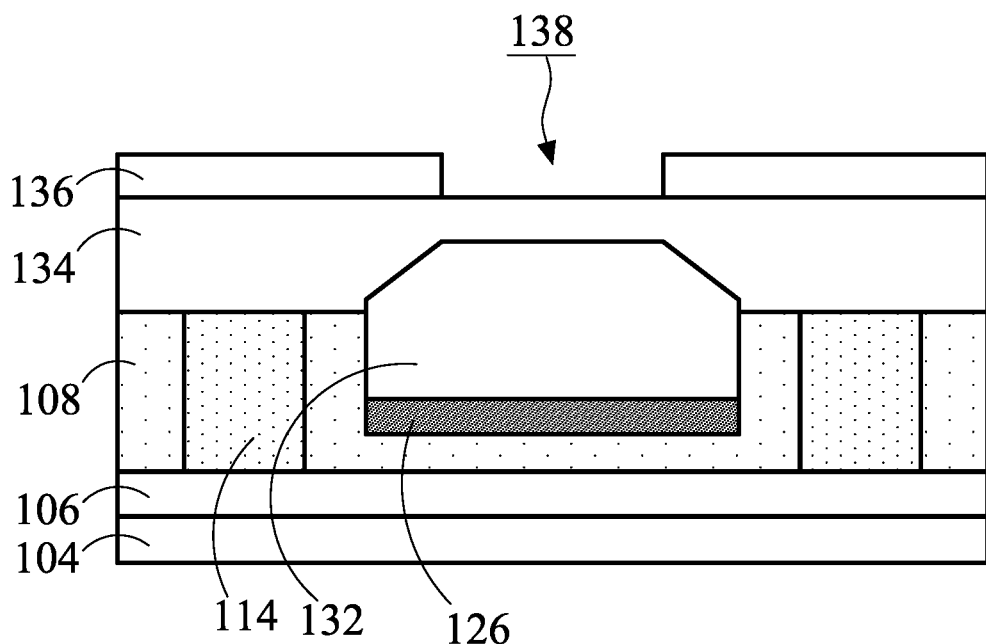
Figure 1N:
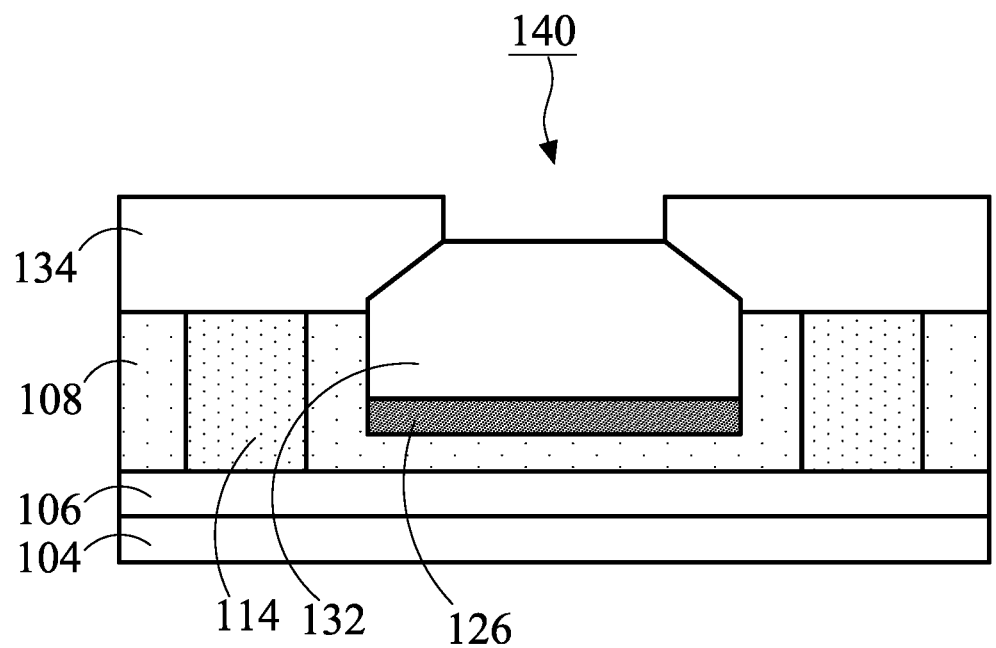
Figure 1O:
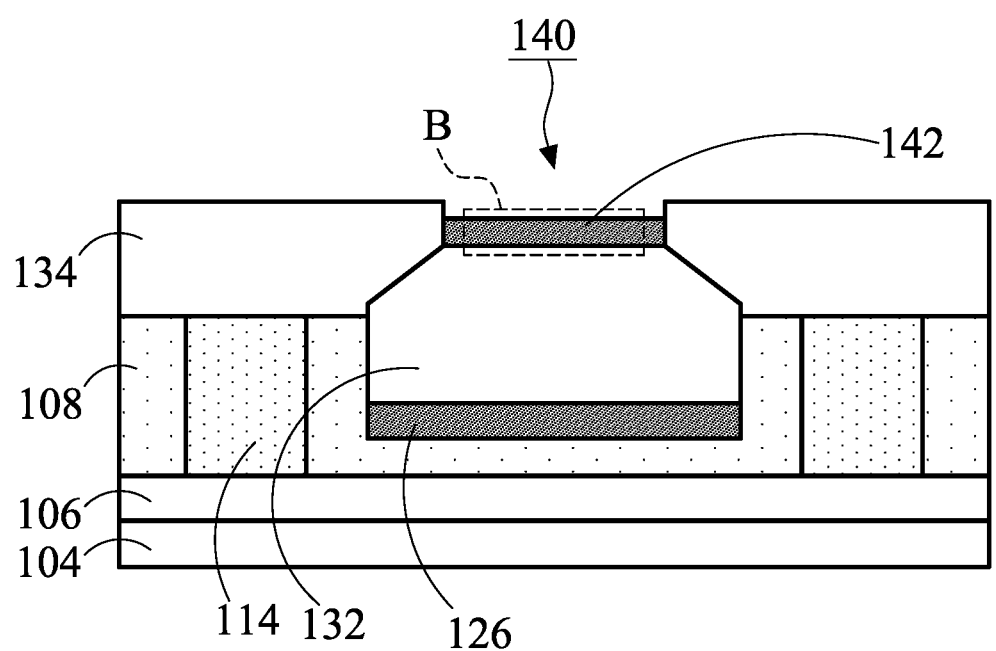
Figures 1, 1O:
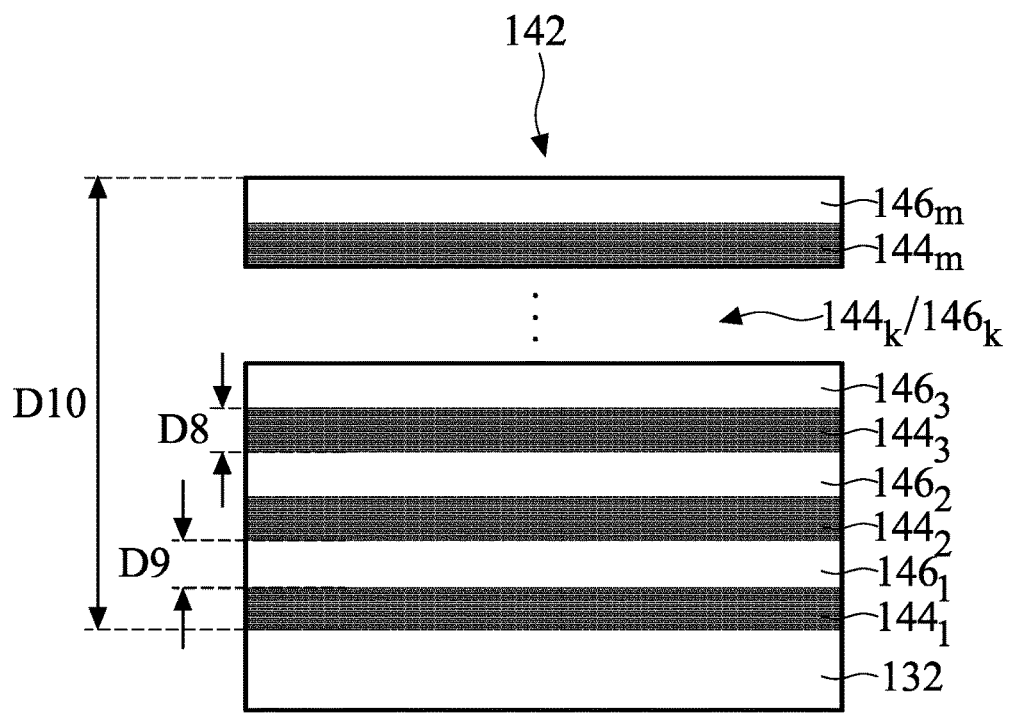
Figure 1P:
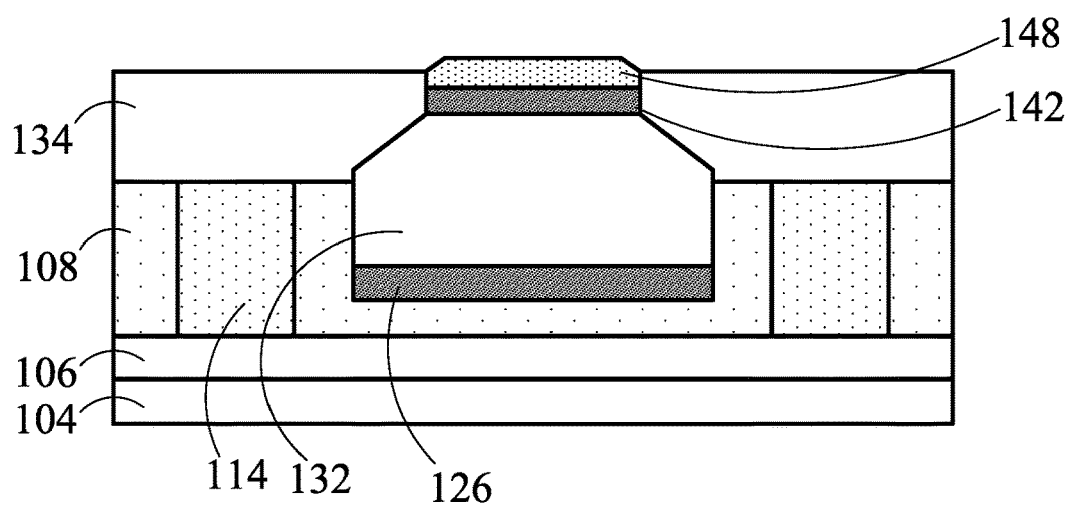
Figure 1Q:
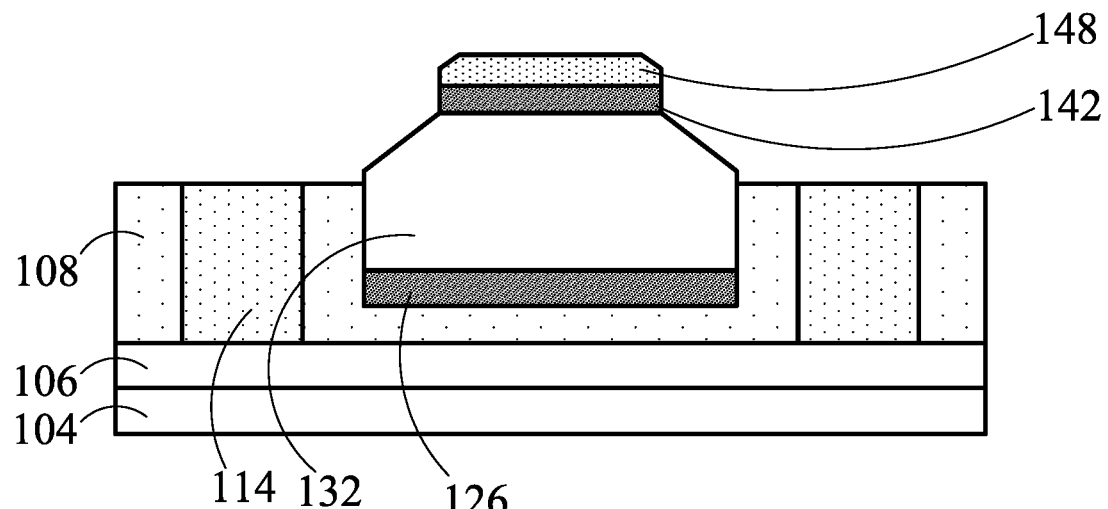
Figure 1R:
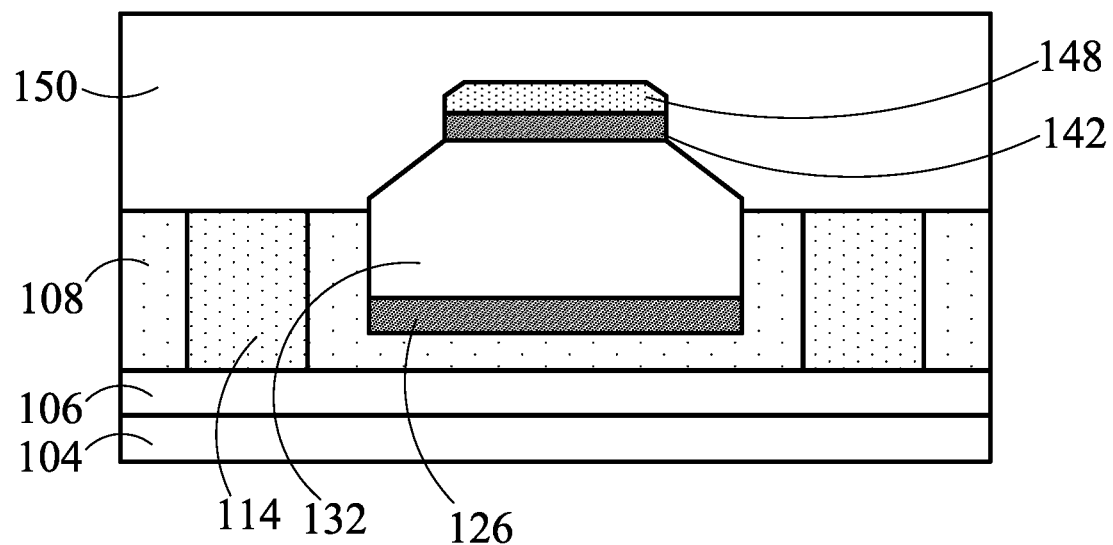
Figure 1S:
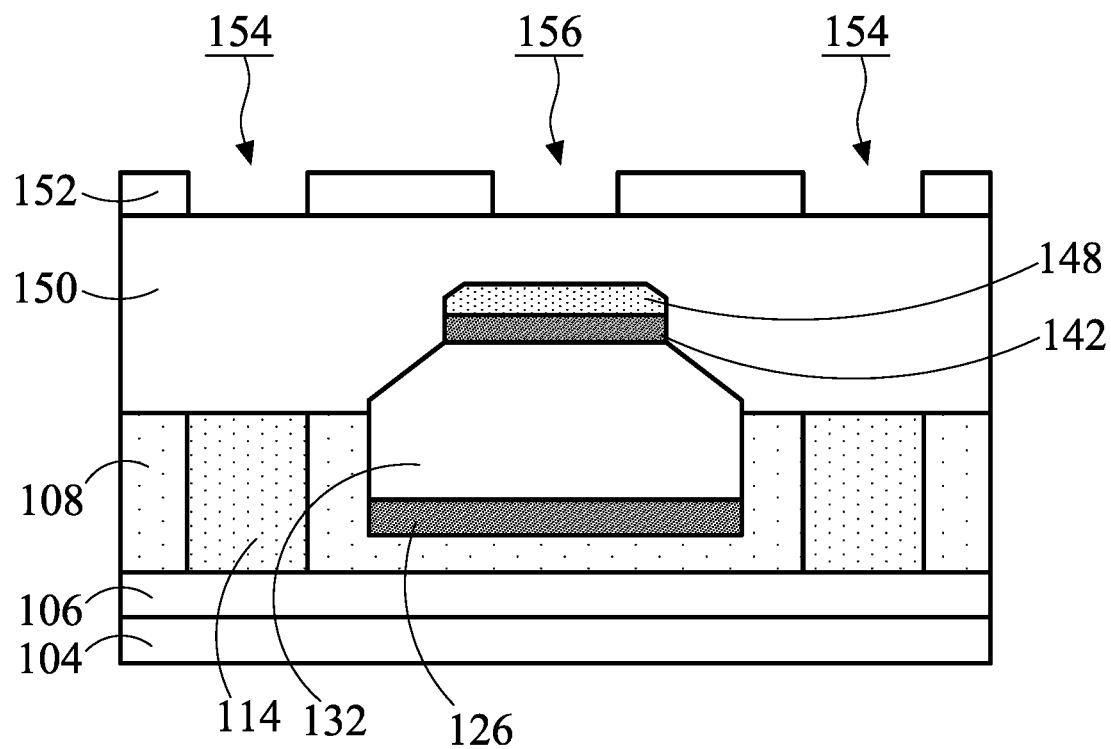
Figure 1T:
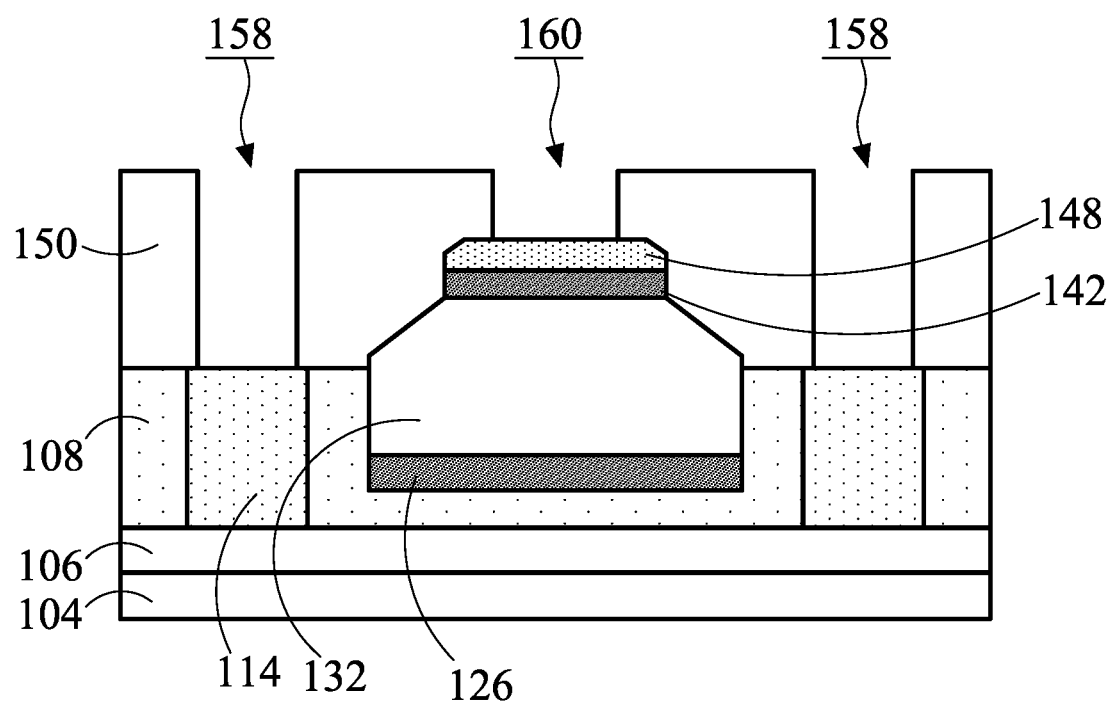
Figure 1U:
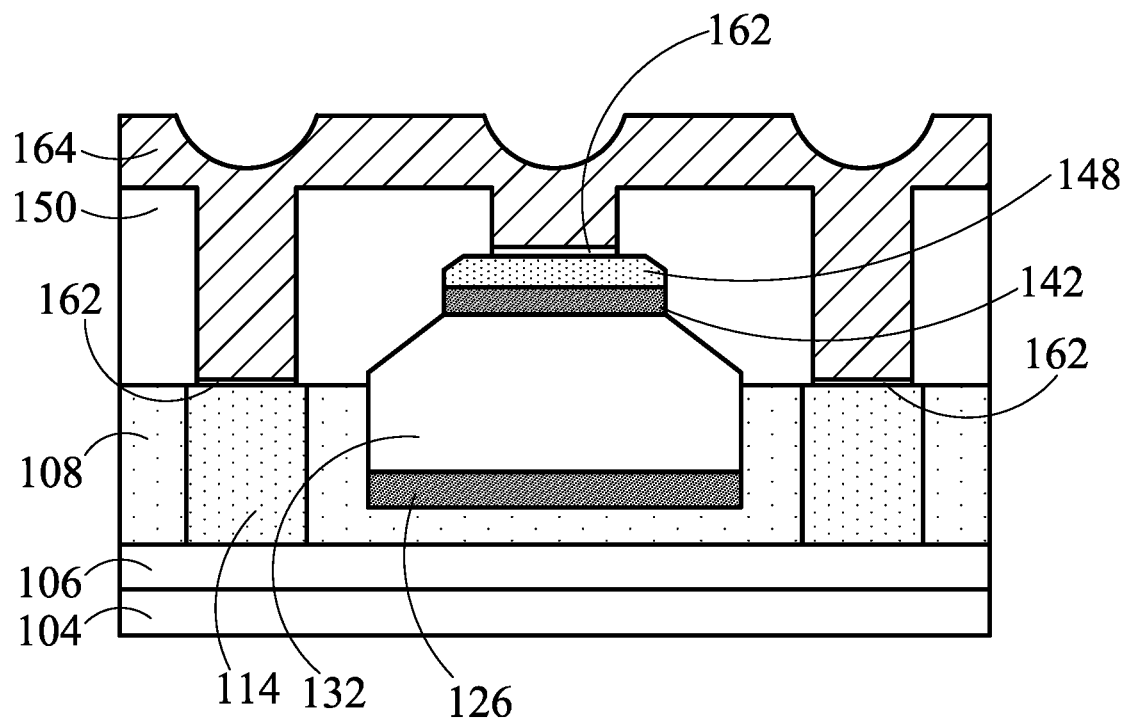
Figure 1V:
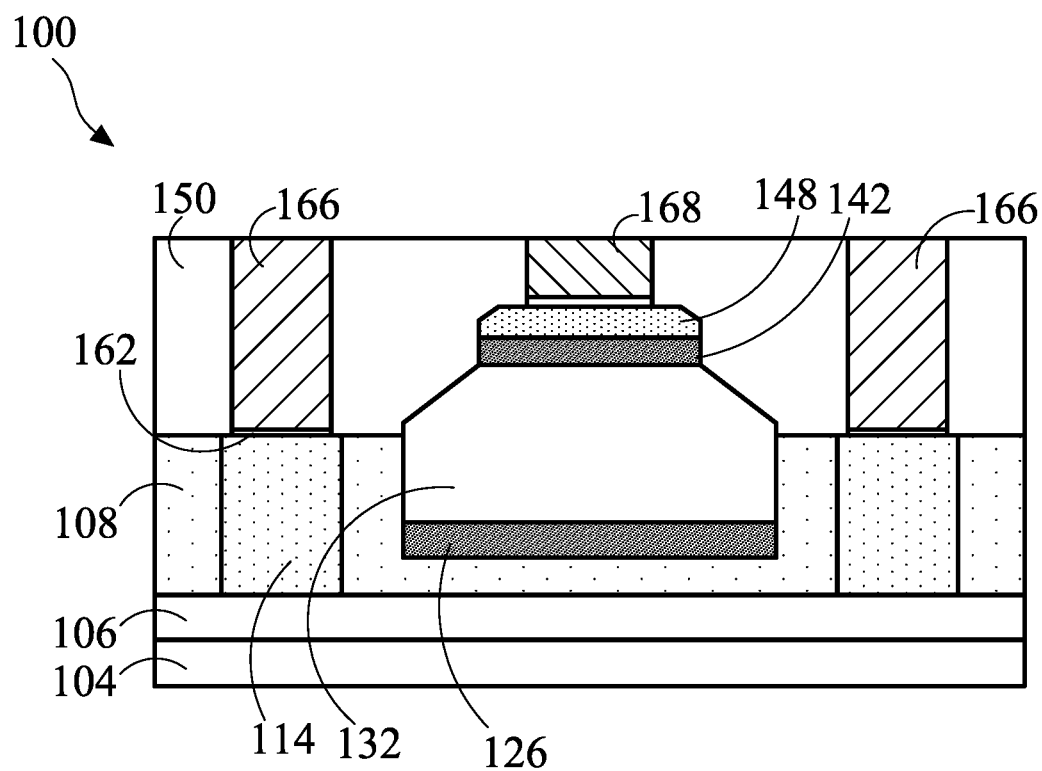

FIGS. 1A through 1V are cross-sectional views illustrating the formation of a photodetector at various intermediate stages, in accordance with some embodiments of the disclosure. A substrate 102 is provided, as shown in FIG. 1A, in accordance with some embodiments. In some embodiments, the substrate 102 is a silicon-on-insulator (SOI) substrate and includes a semiconductor substrate 104 (or semiconductor wafer), a buried oxide layer 106 over the semiconductor substrate 104, and a semiconductor layer 107 over the buried oxide layer 106. It is noted that the SOI substrate provided herein is merely exemplary, and is not meant to be limiting. For example, the substrate 102 may be a semiconductor substrate (wafer) including at least a top portion (layer) that is made of semiconductor material (such as silicon).

In some embodiments, the semiconductor substrate 104 is a silicon substrate. In some embodiments, the semiconductor substrate 104 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof.

In some embodiments, the buried oxide layer 106 is made of an oxide such as silicon oxide. In some embodiments, the buried oxide layer 106 has a thickness in a range from about 500 nm to 5000 nm. In some embodiments, the semiconductor layer 107 is made of silicon, such as intrinsic silicon. For example, an impurity (or an n-type dopant and/or a p-type dopant) in the semiconductor layer 107 has a concentration of less than about $10^{14}$ cm$^{-3}$. In some embodiments, the semiconductor layer 107 has a thickness in a range from about 200 to 600 nm.

An ion implantation process 1000 is blanket performed on the structure of FIG. 1A, as shown in FIG. 1B, in accordance with some embodiments. The semiconductor layer 107 is globally doped with a first conductive type dopant (such as an n-type dopant) during the ion implantation process 1000, thereby forming a doped semiconductor layer 108, in accordance with some embodiments. The n-type dopant may be phosphorous (P) or Arsenic (As). In some embodiments, the semiconductor layer 108 is a moderately-doped n-type (also referred to as n+ herein) doped layer. In some embodiments, the n-type dopant in the semiconductor layer 108 has a dopant concentration in a range from about $3 \times 10^{18}$ cm$^{-3}$ to about $3 \times 10^{19}$ cm$^{-3}$. In some embodiments, an anneal process may be optionally performed to activate the dopant in the semiconductor layer 108.

A patterned mask layer 110 is formed over the upper surface of the semiconductor layer 108, as shown in FIG. 1C, in accordance with some embodiments. In some embodiments, the patterned mask layer 110 is a patterned photoresist layer. The patterned mask layer 110 has opening patterns 112 exposing the upper surface of the semiconductor layer 108, in accordance with some embodiments. For example, a photoresist may be formed on over the upper surface of the semiconductor layer 108, such as by using spin-on coating, and patterned with opening patterns 112 by exposing the photoresist to light using an appropriate photomask. Exposed or unexposed portions of the photoresist may be removed depending on whether a positive or negative resist is used.

An ion implantation process 1050 is performed on the structure of FIG. 1C, as shown in FIG. 1D, in accordance with some embodiments. Portions of the semiconductor layer 108 exposed from the opening patterns 112 are doped with a first conductive type dopant (such as an n-type dopant) during the ion implantation process 1050, thereby forming first (or bottom) electrode regions 114, in accordance with some embodiments. The n-type dopant may be phosphorous (P) or Arsenic (As). The first electrode regions 114 extend from the upper surface of the semiconductor layer 108 to the buried oxide layer 106, in accordance with some embodiments. In some embodiments, the first electrode regions 114 are configured as a cathode of a resulting photodetector to transfer holes generated from a subsequently formed light absorption material.

In some embodiments, the first electrode regions 114 are heavily-doped n-type (also referred to as n++ herein) doped regions. The heavily-doped first electrode regions 114 have lower resistance and may allow a sufficient ohmic contact with subsequently formed contact plugs, thereby providing the resulting photodetector a lower contact resistance. In some embodiments, the n-type dopant in the first electrode regions 114 has a dopant concentration in a range from about $1 \times 10^{20}$ cm$^{-3}$ to about $3 \times 10^{20}$ cm$^{-3}$. That is, the dopant concentration of the first electrode regions 114 is greater than the dopant concentration of the semiconductor layer 108, in accordance with some embodiments. After the ion implantation process 1050, the patterned mask layer 110 is removed using such as an ashing process. In some embodiments, an anneal process may be optionally performed to active the dopant in the semiconductor layer 108.

A protection layer 116 is blanket formed over the upper surface of the semiconductor layer 108 and the upper surface of the first electrode regions 114, as shown in FIG. 1E, in accordance with some embodiments. In some embodiments, the protection layer 116 is made of a dielectric material, such as silicon oxide, silicon nitride, silicon oxynitride, and/or another suitable dielectric material. In some embodiments, the protection layer 116 is deposited using chemical vapor deposition (CVD) such as low pressure CVD (LPCVD), plasma enhanced CVD (PECVD), or other deposition techniques.

A patterned mask layer 118 is formed over the upper surface of the protection layer 116, as shown in FIG. 1F, in accordance with some embodiments. In some embodiments, the patterned mask layer 118 is a patterned photoresist layer. The patterned mask layer 118 has an opening pattern 120 exposing the upper surface of the protection layer 116, in accordance with some embodiments. The opening pattern 120 corresponds to a region of the semiconductor layer 108 between the first electrode regions 114, in accordance with some embodiments. In some embodiments, the opening pattern 120 does not overlay the first electrode regions 114. The patterned mask layer 118 may be formed using similar steps for forming the patterned mask layer 110 as described above.

An etching process is performed on the structure of FIG. 1F to transfer the opening pattern 120 into the protection layer 116, in accordance with some embodiments. A portion of the protection layer 116 exposed from the opening pattern 120 is removed until the semiconductor layer 108 is exposed, thereby forming an opening pattern 122, as shown in FIG. 1G, in accordance with some embodiments. The etching process may be dry plasma etching (e.g., using carbon fluoride gas as etchant) or wet chemical etching (e.g., using dilute hydrofluoric acid as etchant).

An etching process is performed on the structure of FIG. 1G to transfer the opening pattern 122 into the semiconductor layer 108, in accordance with some embodiments. A portion of the semiconductor layer 108 exposed from the opening pattern 122 is removed, thereby forming a cavity 124, as shown in FIG. 1H, in accordance with some embodiments. The etching process may be dry plasma etching such as RIE (Reactive Ion Etching) or wet chemical etching. The cavity 124 is located between the first electrode regions 114, in accordance with some embodiments. The cavity 124 extends from the upper surface of the semiconductor layer 108 to an etching depth D1.

In some embodiments, the etching depth D1 is controlled (e.g., by an etching time) and is in a range from about 150 nm to about 350 nm. In some embodiments, the cavity 124 has a width D2 greater than about 300 nm (e.g., 300-700 nm). If the width D2 of the cavity 124 is too small, it is potentially difficult to grow a semiconductor material in a subsequent epitaxial growth process. In some embodiments, a portion of the semiconductor layer 108 remaining below the cavity 124 has a thickness D3 in a range from about 100 nm to about 200 nm. In some embodiments, the etched surfaces of the semiconductor layer 108, e.g., sidewalls 124S and a bottom surface 124B of the cavity 124, are rough, especially the bottom surface 124B.

A smoothing process 1100 is performed on the structure of FIG. 1H, as shown in FIG. 1I, in accordance with some embodiments. The sidewalls 124S and the bottom surface 124B of the cavity 124 are smoothed to reduce the roughness of the sidewalls 124S and the bottom surface 124B of the cavity 124, in accordance with some embodiments. The semiconductor surface having low roughness may increase the activation energy of nucleation of crystalline defects (such as misfit dislocation and threading dislocation) in a subsequent formed epitaxial material, thereby reducing the likelihood of the formation of the crystalline defects in a subsequently formed light absorption material.

The smoothing process 1100 includes at least one cycle of an oxidation process and an oxide-removal process, in accordance with some embodiments. In some embodiments, the oxidation process is performed using a dry plasma oxidation and/or wet chemical oxidation to oxidize exposed portions of the semiconductor layer 108, thereby forming an oxide layer (e.g., silicon oxide) at the sidewalls 124S and the bottom surface 124B of the cavity 124. In some embodiments, the oxidation process is performed within a temperature range of about 400-600° C. In some embodiments, the oxide-removal process uses such as dilute hydrofluoric (dHf) acid to removes the oxide layer. In some embodiments, the cycle of an oxidation process and an oxide-removal process may repeat about 1-10 times.

A first (lower) superlattice structure 126 is formed on the semiconductor layer 108 from the cavity 124, as shown in FIG. 1J, in accordance with some embodiments. FIG. 1J-1 is an enlarged view of area A shown in FIG. 1J, in accordance with some embodiments of the disclosure. The first superlattice structure 126 includes multiple pairs of silicon layer 128$i$/silicon germanium layer 130$_i$ vertically stacked over the exposed surface of the semiconductor layer 108 (i.e., the bottom surface 124B of the cavity 124), as shown in FIG. 1J-1, in accordance with some embodiments. Subscript "i" represents the level of a silicon layer 128 and/or the level of a silicon germanium layer 130 and is an integer of 1 (first-level) to "j" (top-level), and the top level "j" may be 2-15, in accordance with some embodiments. That is, the silicon layers 128 and the silicon germanium layers 130 are vertically alternating stacked from one another, in accordance with some embodiments. The first superlattice structure 126 is configured as a buffer layer to mitigate or eliminate misfit dislocations between a subsequently formed light absorption material and the semiconductor layer 108, in accordance with some embodiments.

In some embodiments, each of the silicon layers 128 has a thickness D4 in a range from about 3 nm to about 15 nm. In some embodiments, each of the silicon germanium layers 130 has a thickness D5 in a range from about 3 nm to about 15 nm. In some embodiments, the first-level (bottommost) silicon layer 128$_1$ is thickest among the layers of the first superlattice structure 126. In some embodiments, the first superlattice structure 126 has a thickness D6 in a range from about 30 to about 150 nm. The thicknesses D6 of the first superlattice structure 126 may be adjusted by adjusting the number of the pairs of silicon layer 128/silicon germanium layer 130 and/or the thickness D4 of the silicon layers 128 and/or the thickness D5 of the silicon germanium layers 130, which may depend on the device performance requirement, e.g., speed, responsivity, etc.

In some embodiments, the silicon germanium layers 130 are made of $Si_{1-x}Ge_x$, wherein x represents the atomic percentage of germanium and $0<x<1$ such as $0.1 \leq x \leq 0.9$. In some embodiments, the atomic percentages of germanium (x) in the silicon germanium layers 130 vary with their levels "i". In detail, the atomic percentages of germanium in the silicon germanium layers 130 of the first superlattice structure 126 increase in order as the level "i" of a silicon germanium layer 130$i$ increases from the first-level (bottommost silicon germanium layer 130$_1$) to the top-level (topmost silicon germanium layer 130), in accordance with some embodiments.

For example, the increase in atomic percentage may be consistent. In an embodiment where the top level "j" is 4, the silicon germanium layers 130$_1$, 130$_2$, 130$_3$ and 130$_4$ are made of $Si_{0.8}Ge_{0.2}$, $Si_{0.6}Ge_{0.4}$, $Si_{0.4}Ge_{0.6}$ and $Si_{0.2}Ge_{0.8}$ respectively. In an embodiment where the top level "j" is 9, the silicon germanium layers 130$_1$, 130$_2$, 130$_3$, 130$_4$, 130$_5$, 130$_6$, 130$_7$, 130$_8$ and 130$_9$ are made of $Si_{0.9}Ge_{0.1}$, $Si_{0.8}Ge_{0.2}$, $Si_{0.7}Ge_{0.3}$, $Si_{0.6}Ge_{0.4}$, $Si_{0.5}Ge_{0.5}$, $Si_{0.4}Ge_{0.6}$, $Si_{0.3}Ge_{0.7}$, $Si_{0.2}Ge_{0.8}$ and $Si_{0.1}Ge_{0.9}$, respectively.

For example, the increase in atomic percentage may be inconsistent. In an embodiment where the top level "j" is 4, the silicon germanium 130$_1$, 130$_2$, 130$_3$ and 130$_4$ are made of $Si_{0.9}Ge_{0.1}$, $Si_{0.8}Ge_{0.2}$, $Si_{0.5}Ge_{0.5}$ and $Si_{0.2}Ge_{0.8}$.

The first superlattice structure 126 including multiple pairs of silicon layer 128$i$/silicon germanium layer 130$i$ is in-situ doped with a first conductive type dopant (such as an n-type dopant), in accordance with some embodiments. The n-type dopant may be phosphorous (P) or Arsenic (As). In some embodiments, the first superlattice structure 126 is a lightly-doped n-type (also referred to as n- herein) doped region and the n-type dopant in each of the silicon layers 128 and the silicon germanium layers 130 has a dopant concentration in a range from about $1 \times 10^{17}$ cm$^{-3}$ to about $9 \times 10^{17}$ cm$^{-3}$. In some other embodiments, the first superlattice structure 126 is a moderately-doped n-type (also referred to as n+ herein) doped region and the n-type dopant in the first superlattice structure 126 has a dopant concentration in a range from about $3 \times 10^{18}$ cm$^{-3}$ to about $3 \times 10^{19}$ cm$^{-3}$. That is, the dopant concentration of the first superlattice structure 126 is equal to or less than the dopant concentration of the semiconductor layer 108, in accordance with some embodiments. In alternative embodiments, the first superlattice structure 126 is undoped.

In some embodiments, the silicon layers 128 and the silicon germanium layers 130 are formed using an epitaxial growth process, such as molecular beam epitaxy (MBE), metal organic chemical vapor deposition (MOCVD), or vapor phase epitaxy (VPE), or other suitable techniques. For example, the epitaxial growth process may include multiple cycles of growing a silicon layer 128 and growing a silicon germanium layer 130. In an embodiment where first superlattice structure 126 is doped with phosphorous, a silicon-containing precursor, e.g., silane ($SiH_4$) gas and/or dichlorosilane (DCS) gas, along with a doping precursor, e.g., $PH_3$, $PF_3$, and/or $PF_5$, may be delivered to an epitaxial growth chamber; the silicon-containing precursor may react to the exposed surface of the semiconductor layer 108 uncovered by the protection layer 116 and begin to grow a phosphorous-doped first-level silicon layer $128_1$. The silicon-containing precursor, e.g., silane gas and/or dichlorosilane gas and a germanium-containing precursor, e.g., germane ($GeH_4$) gas, along with the doping precursor, e.g., $PH_3$, $PF_3$, and/or $PF_5$, may be delivered to the epitaxial growth chamber; the silicon-containing precursor and the germanium-containing precursor may react to the surface of the first-level silicon layer $128_1$ and begin to grow a phosphorous-doped first-level silicon germanium layer $130_1$. The cycle of growing a silicon layer 128 and growing a silicon germanium layer 130 may repeat for 2-15 times to form the first superlattice structure 126. Furthermore, a ratio of a flow rate of the germanium-containing precursor to a total rate of the silicon-containing precursor and the germanium-containing precursor during growing a silicon germanium layer $130_i$ may be adjusted higher than growing a silicon germanium layer $130_{i-1}$ of a previous cycle, thereby allowing the silicon germanium layers 130 having increasing atomic percentages of germanium as the level increases.

A light absorption material 132 is formed on the top-level silicon germanium layer $130_k$ of the first superlattice structure 126 from the cavity 124, as shown in FIG. 1K, in accordance with some embodiments. In some embodiments, the light absorption material 132 is intrinsic germanium. For example, an impurity (or an n-type dopant and/or a p-type dopant) in the light absorption material 132 has a concentration of less than about $10^{14}$ $cm^{-3}$. The light absorption material 132 is configured to receive and absorb a light signal (e.g., infrared light) and generate an electric signal e.g., an electron-hole pair (EHP). The upper portion of the light absorption material 132 may protrude above the upper surface of the semiconductor layer 108, in accordance with some embodiments. In some embodiments, the light absorption material 132 has a thickness D7 in a range from about 100 nm to about 500 nm. In some embodiments, the light absorption material 132 has a width D2 greater than about 350 nm (e.g., 400-700 nm). In some embodiments, the thickness D7 is less than the width D2 and a ratio of the thickness D7 to the width D2 is in a range from about 0.3 to about 0.8. In some embodiments, a ratio of the thickness D6 to the thickness D7 is in a range from about 0.1 to about 0.3.

In some embodiments, the light absorption material 132 is formed using an epitaxial growth process, such as MBE, MOCVD, or VPE, or other suitable techniques. In some embodiments, the light absorption material 132 is formed with faceted surfaces. After the formation of the light absorption material 132, the protection layer 116 may be optionally removed.

A protection layer 134 is blanket formed over the upper surface of the semiconductor layer 108 and covers the light absorption material 132, as shown in FIG. 1L, in accordance with some embodiments. In some embodiments, the protection layer 134 is made of a dielectric material, such as silicon oxide, silicon nitride, silicon oxynitride, and/or other suitable dielectric materials. In some embodiments, the protection layer 134 is deposited using chemical vapor deposition (CVD) such as LPCVD), PECVD, or another deposition technique.

A patterned mask layer 136 is formed over the upper surface of the protection layer 134, as shown in FIG. 1M, in accordance with some embodiments. In some embodiments, the patterned mask layer 136 is a patterned photoresist layer. The patterned mask layer 136 has an opening pattern 138 exposing the upper surface of the protection layer 134, in accordance with some embodiments. The opening pattern 138 corresponds to the light absorption material 132, in accordance with some embodiments. The patterned mask layer 136 may be formed using similar steps for forming the patterned mask layer 110 as described above.

An etching process is performed on the structure of FIG. 1M to transfer the opening pattern 138 into the protection layer 134, in accordance with some embodiments. A portion of the protection layer 134 exposed from the opening pattern 138 is removed until the light absorption material 132 is exposed, thereby forming a cavity 140, as shown in FIG. 1N, in accordance with some embodiments. The etching process may be dry plasma etching such as RIE (e.g., using as carbon fluoride gas as etchant) or wet chemical etching (e.g., using as dilute hydrofluoric acid as etchant). After the etching process, the patterned mask layer 136 is removed using such as an ashing process.

A second (upper) superlattice structure 142 is formed on the light absorption material 132 from the cavity 140, as shown in FIG. 1O, in accordance with some embodiments. FIG. 1O-1 is an enlarged view of area B shown in FIG. 1O, in accordance with some embodiments of the disclosure. The second superlattice structure 142 includes multiple pairs of germanium layer $144_k$/silicon germanium layer $146_k$ vertically stacked over the exposed surface of the light absorption material 132 (i.e., the bottom surface of the cavity 140), as shown in FIG. 1O-1, in accordance with some embodiments. Subscript "k" represents the level of a germanium layer 144 and/or the level of a silicon germanium layer 146 and is an integer of 1 (first-level) to "m" (top-level), and the top level "m" may be 2-15, in accordance with some embodiments. That is, the germanium layers 144 and the silicon germanium layers 146 are vertically alternating stacked from one another, in accordance with some embodiments. The second superlattice structure 142 is configured as a buffer layer to mitigate or eliminate misfit dislocations between the light absorption material 132 and a subsequently formed electrode region, in accordance with some embodiments.

In some embodiments, each of the germanium layers 144 has a thickness D8 in a range from about 3 nm to about 15 nm. In some embodiments, each of the silicon germanium layers 146 has a thickness D9 in a range from about 3 nm to about 15 nm. In some embodiments, the second superlattice structure 142 has a thickness D10 in a range from about 30 to about 150 nm. In some embodiments, a ratio of the thickness D10 to the thickness D7 is in a range from about 0.1 to about 0.3. The thicknesses D10 of the second superlattice structure 142 may be adjusted by adjusting the number of the pairs of germanium layer 144/silicon germanium layer 146 and/or the thickness D8 of the germanium layers 144 and/or the thickness D9 of the silicon germanium layers 146, which may depend on the device performance requirement, e.g., speed, responsivity, etc.

In some embodiments, the silicon germanium layers 146 are made of $Si_{1-y}Ge_y$, wherein y represents the atomic percentage of germanium and 0<y<1 such as 0.1≤y≤0.9. In some embodiments, the atomic percentages of germanium (y) in the silicon germanium layers 146 vary with their levels "k". In detail, the atomic percentages of germanium in the silicon germanium layers 146 of the second superlattice structure 142 decrease in order as the level "k" of a silicon germanium layer $146_k$ increases from the first-level (bottommost silicon germanium layer $146_1$) to the top-level (topmost silicon germanium layer $146_m$), in accordance with some embodiments.

For example, the decrease in atomic percentage may be consistent. In an embodiment where the top level "m" is 4, the silicon germanium layers $146_1$, $146_2$, $146_3$ and $146_4$ are made of $Si_{0.2}Ge_{0.8}$, $Si_{0.4}Ge_{0.6}$, $Si_{0.6}Ge_{0.4}$ and $Si_{0.8}Ge_{0.2}$, respectively. In an embodiment where the top level "m" is 9, the silicon germanium layers $146_1$, $146_2$, $146_3$, $146_4$, $146_5$, $146_6$, $146_7$, $146_8$ and $146_9$ are made of $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$ and $Si_{0.9}Ge_{0.1}$, respectively.

For example, the decrease in atomic percentage may be inconsistent. In an embodiment where the top level "m" is 4, the silicon germanium layers $146_1$, $146_2$, $146_3$ and $146_4$ are made of $Si_{0.1}Ge_{0.9}$, $Si_{0.2}Ge_{0.8}$, $Si_{0.5}Ge_{0.5}$ and $Si_{0.8}Ge_{0.2}$.

The second superlattice structure 142 including multiple pairs of germanium layer $144_k$/silicon germanium layer $146_k$ is in-situ doped with a second conductive type dopant (such as a p-type dopant), in accordance with some embodiments. The p-type dopant may be boron (B) or $BF_2$. In some embodiments, the second superlattice structure 142 is a lightly-doped p-type (also referred to as p- herein) doped region and the p-type dopant in each of the germanium layers 144 and the silicon germanium layers 146 has a dopant concentration in a range from about $1\times10^{17}$ cm$^{-3}$ to about $9\times10^{17}$ cm$^{-3}$. In some other embodiments, the second superlattice structure 142 is a moderately-doped p-type (also referred to as p+ herein) doped region and the p-type dopant in the second superlattice structure 142 has a dopant concentration in a range from about $3\times10^{18}$ cm$^{-3}$ to about $3\times10^{19}$ cm$^{-3}$. In alternative embodiments, the second superlattice structure 142 is undoped.

In some embodiments, the second superlattice structure 142 is formed using an epitaxial growth process, such as MBE, MOCVD, or VPE, or other suitable techniques. For example, the epitaxial growth process may include multiple cycles of growing a germanium layer 144 and growing a silicon germanium layer 146. In an embodiment where second superlattice structure 142 is doped with boron, a germanium-containing precursor, e.g., germane ($GeH_4$) gas, along with a doping precursor, e.g., $BF_3$, $B_2H_6$, and/or $BCl_3$, may be delivered to an epitaxial growth chamber; the germanium-containing precursor may react to the exposed surface of the light absorption material 132 and begin to grow a boron-doped first-level germanium layer $144_1$. A silicon-containing precursor, e.g., silane gas, and/or dichlorosilane gas and the germanium-containing precursor, e.g., germane ($GeH_4$) gas, along with the doping precursor, e.g., $BF_3$, $B_2H_6$, and/or $BCl_3$, may be delivered to the epitaxial growth chamber; the silicon-containing precursor and the germanium-containing precursor may react to the surface of the first-level germanium layer $144_1$ and begin to grow a boron-doped first-level silicon germanium layer $146_1$. The cycle of growing a germanium layer 144 and growing a silicon germanium layer 146 may repeat for 2-15 times to form the second superlattice structure 142. Furthermore, a ratio of a flow rate of the germanium-containing precursor to a total rate of the silicon-containing precursor and the germanium-containing precursor during growing a silicon germanium layer $146_i$ may be adjusted lower than growing a silicon germanium layer $146_{i-1}$ of a previous cycle, thereby allowing the silicon germanium layers 144 having decreasing atomic percentages of germanium as the level increases.

A second (or top) electrode region 148 is formed on the top-level silicon germanium layer $146_m$ of the second superlattice structure 142 from the cavity 140, as shown in FIG. 1P, in accordance with some embodiments. An upper portion of the second electrode region 148 may protrude above the upper surface of the semiconductor layer 108, in accordance with some embodiments. In some embodiments, the second electrode region 148 is configured as an anode of a resulting photodetector to transfer electrons generated from the light absorption material 132.

In some embodiments, the second electrode region 148 made of silicon (Si). In some embodiments, the second electrode region 148 is formed using an epitaxial growth process, such as MBE, MOCVD, or VPE, or other suitable techniques. The second electrode region 148 is in-situ doped with a second conductive type dopant (such as a p-type dopant) during the epitaxial growth process, in accordance with some embodiments. The p-type dopant may be boron (B) or $BF_2$. In some embodiments, the second electrode region 148 is a heavily-doped p-type (also referred to as p++ herein) doped region. The heavily-doped second electrode region 148 has lower resistance and may allow a sufficient ohmic contact with a subsequently formed contact plug, thereby providing the resulting photodetector a lower contact resistance. In some embodiments, the p-type dopant in the second electrode region 148 has a dopant concentration in a range from about $1\times10^{20}$ cm$^{-3}$ to about $3\times10^{20}$ cm$^{-3}$. That is, the dopant concentration of the second electrode region 148 is greater than the dopant concentration of the second superlattice structure 142, in accordance with some embodiments.

The protection layer 134 is removed using an etching process to expose the semiconductor layer 108, as shown in FIG. 1Q, in accordance with some embodiments. In some embodiments, the etching process is dry plasma etching such as RIE (e.g., using as carbon fluoride gas as etchant) or wet chemical etching (e.g., using as dilute hydrofluoric acid as etchant).

A dielectric layer 150 is formed over the upper surface of the semiconductor layer 108 and covers the second electrode region 148 and the light absorption material 132, as shown in FIG. 1R, in accordance with some embodiments. In some embodiments, the dielectric layer 150 is made of a dielectric material, such as silicon oxide, silicon nitride, silicon oxynitride, and/or another suitable dielectric material. In some embodiments, the dielectric layer 150 is multilayer structure, e.g., including a silicon oxide pad layer and a silicon nitride bulk layer over the silicon oxide pad layer. In some embodiments, the dielectric layer 150 is deposited using CVD such as LPCVD, PECVD, or other deposition techniques. In some embodiments, the dielectric layer 150 has a thickness in a range from about 200 nm to about 1000 nm.

A patterned mask layer 152 is formed over the upper surface of the dielectric layer 150, as shown in FIG. 1S, in accordance with some embodiments. In some embodiments, the patterned mask layer 152 is a patterned photoresist layer. The patterned mask layer 152 has opening patterns 154 and 156 exposing the upper surface of the dielectric layer 150, in accordance with some embodiments. The opening patterns 154 correspond to the first electrode regions 114, in accordance with some embodiments. The opening pattern 156 corresponds to the second electrode region 148, in accordance with some embodiments. The patterned mask layer 152 may be formed using similar steps for forming the patterned mask layer 110 as described above.

An etching process is performed on the structure of FIG. 1S to transfer the opening patterns 154 and 156 into the dielectric layer 150 until the first electrode regions 114 and the second electrode region 148 are exposed, in accordance with some embodiments. Portions of the dielectric layer 150 exposed from the opening pattern 154 and 156 are removed, thereby forming contact openings 158 and 160, respectively, as shown in FIG. 1T, in accordance with some embodiments. The contact openings 158 correspond to the first electrode regions 114, in accordance with some embodiments. The contact opening 160 corresponds to the second electrode region 148, in accordance with some embodiments. The etching process may be dry plasma etching such as RIE or wet chemical etching. After the etching process, the patterned mask layer 152 is removed using such as an ashing process.

A silicide layer 162 is formed on the upper surfaces of the first electrode regions 114 exposed from the contact openings 158 and on the upper surface of the second electrode region 148 exposed from the contact opening 160, as shown in FIG. 1U, in accordance with some embodiments. In some embodiments, the silicide layer 162 is made of NiSi, CoSi, TiSi and/or WSi. In some embodiments, the formation of the silicide layer 162 includes depositing a metal material over the structure of FIG. 1T, and annealing the structure such that the semiconductor material (e.g., Si) from the first electrode regions 114 and the second electrode region 148 reacts with the metal material to form the silicide layer 162. In some embodiments, the metal material for the silicide layer 162 is deposited using PVD, ALD, CVD, e-beam evaporation, electroplating (ECP), electroless deposition (ELD), another suitable method, or a combination thereof. The anneal process may be Rapid Thermal Anneal (RTA). After the anneal process, an unreacted metal material is removed by wet etching.

A conductive material 164 is formed over the upper surface of the dielectric layer 150 and overfill the contact openings 158 and 160, as shown in FIG. 1U, in accordance with some embodiments. In some embodiments, the conductive material is metal or metal nitride, for example, cobalt (Co), nickel (Ni), tungsten (W), titanium (Ti), tantalum (Ta), copper (Cu), aluminum (Al), ruthenium (Ru), molybdenum (Mo), TiN, TaN, and/or a combination thereof. In some embodiments, the conductive material 164 is deposited using PVD, ALD, CVD, ECP, ELD, another suitable method, or a combination thereof. The contact material 164 may have a multilayer structure including, for example, an adhesive/barrier layer (such as Ti, TiN, Ta, TaN, etc.) and a metal bulk layer (such as W, Co, Mo, Ru, Cu, Al, etc) over the adhesive/barrier layer. The adhesive/barrier layer may prevent the metal from diffusing into the dielectric layer 150 and/or enhance adhesion between the dielectric layer 150 and the metal bulk layer. The metal bulk layer may reduce the contact resistance of the resulting photodetector.

A planarization process is performed on the structure of FIG. 1U to remove a portion of the conductive material 164 over the upper surface of the dielectric layer 150 until the upper surface of the dielectric layer 150 is exposed, thereby producing a photodetector 100, as shown in FIG. 1V, in accordance with some embodiments. The planarization process may be chemical mechanical polish (CMP). Portions of the conductive material 164 remaining in the contact openings 158 and 160 forms contact plugs 166 and 168, respectively. The contact plugs 166 pass through the dielectric layer 150 and land on the silicide layer 162 over the first electrode regions 114, in accordance with some embodiments. The contact plug 168 passes through the dielectric layer 150 and lands on the silicide layer 162 over the second electrode region 148, in accordance with some embodiments.

The first (bottom) electrode regions 114 and the second (top) electrode region 148 of the photodetector 100 are disposed vertically opposite to one another with respect to the light absorption material 132, and therefore the photodetector 100 is referred to as a vertical-type photodetector, in accordance with some embodiments. Once light absorption material 132 absorbs a light signal and generates an electron-hole pair, hole passes through the first superlattice structure 126 and the semiconductor layer 108 to be swept to the first electrode regions 114 (cathode) while the electron passes through the second superlattice structure 142 to be swept to the second electrode region 148 (anode). Because the thickness D7 of the light absorption material 132 is less than the width D2 of the light absorption material 132, the vertical configuration of the first electrode regions 114 and the second electrode regions 148 may improve the speed of the photodetector 100 due to a short transfer path.

Because silicon and germanium has a 4.2% of lattice mismatch, in some instance where a germanium light absorption material is in direct contact with a silicon layer, the lattice mismatch may lead to the formation of crystalline defects (e.g., misfit dislocation and/or threading dislocation) at the silicon and germanium interface and/or in the germanium light absorption material. The crystalline defects may induce dark current, which decreases signal-to-noise ratios for a photodetector. Embodiments of the present disclosure utilizes the first superlattice structure 126 as a buffer layer between the light absorption material 132 and the underlying semiconductor layer 108 and the second superlattice structure 142 as a buffer layer between the light absorption material 132 and overlying the second electrode region 148. Therefore, the first superlattice structure 126 and the second superlattice structure 142 may mitigate or eliminate misfit dislocations between the germanium light absorption material 132 and the silicon layer (e.g., the semiconductor layer 108 and the second electrode region 148), which may reduce dark current, thereby enhancing the performance of the photodetector, e.g., signal-to-noise ratios. Moreover, the superlattice structures may reduce the band-gap offset between silicon and germanium, which may improve the performance of the photodetector, e.g., responsivity.

Furthermore, the first superlattice structure 126 includes the silicon germanium layer 130 having the atomic percentage of germanium increasing in order as the level of the silicon germanium layer 130 increase, lattice mismatch between the light absorption material 132 and the semiconductor layer 108 may be further mitigated or eliminated. Similarly, the second superlattice structure 142 includes the silicon germanium layer 146 having the atomic percentage of germanium decreasing in order as the level of the silicon germanium layer 146 increase, lattice mismatch between the light absorption material 132 and the second electrode region 148 may be further mitigated or eliminated.

In addition, because the first superlattice structure 126 and the second superlattice structure 142 may be in-situ doped with dopants during the epitaxial growth processes instead of using ion implantation, an anneal process may be omitted, thereby lowering a thermal budget during fabricating the photodetector 100. The lower thermal budget may mitigate or prevent the diffusion of dopants (such as from the semiconductor layer and/or the first electrode region) into the light absorption material 132, which in turn allows the light absorption material to maintain large active region and high electric field. As a result, the performance of the photodetector 100 (e.g., speed) may be further enhanced.

Figure 2:
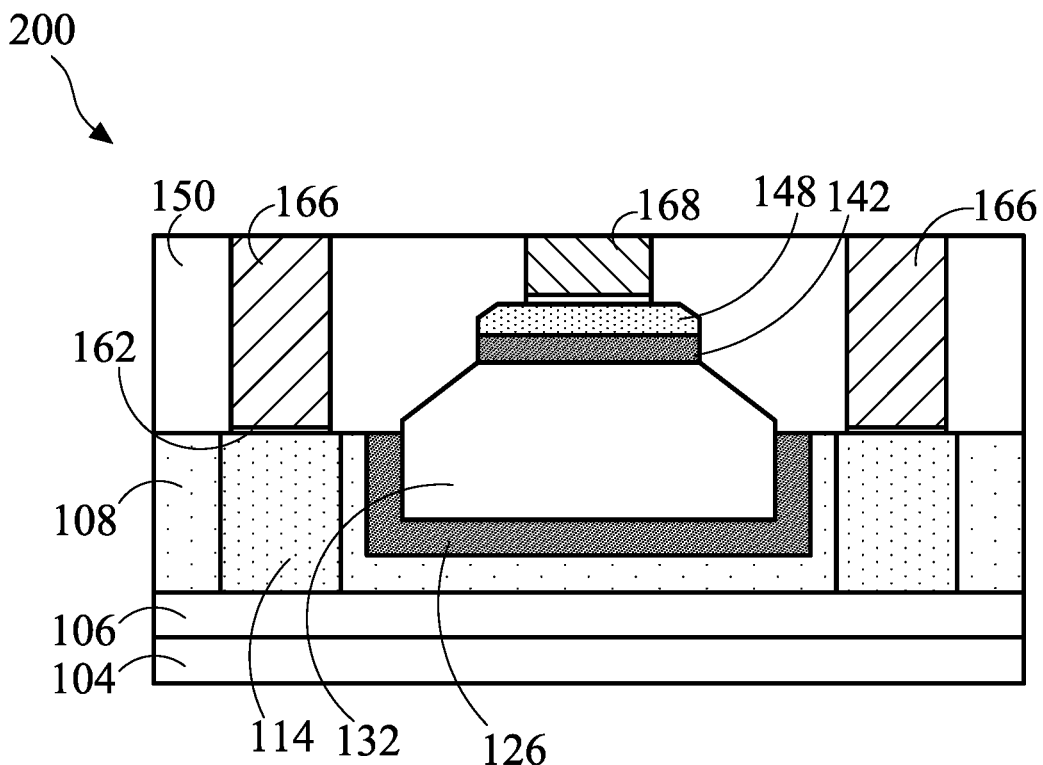
FIG. 2 is a modification of the cross-sectional view of FIG. 1V, in accordance with some embodiments.

FIG. 2 is a modification of the cross-sectional view of FIG. 1V in accordance with some embodiments. FIG. 2 shows a photodetector 200 which is similar to the photodetector 100 of FIG. 1V except that the first superlattice structure 126 has a U-shape profile.

During the epitaxial growth process for forming the first superlattice structure 126, the silicon-containing precursor may react to the exposed semiconductor surfaces of the semiconductor layer 108 so that the first-level silicon layer $128_1$ extends along the sidewalls 124S and the bottom surface 124B of the cavity 124 and has a U-shape profile, in accordance with some embodiments. The first-level silicon germanium layer $130_1$ is then formed on the first-level silicon layer $128_1$ and conforms with the profile of the first-level silicon layer $128_1$, in accordance with some embodiments. As a result, after the completion of the epitaxial growth process, the first superlattice structure 126 extends along the sidewalls 124S and the bottom surface 124B of the cavity 124 and has a U-shape profile. In some embodiments, a thickness of the first superlattice structure 126 along the sidewall 124S of the cavity 124 is less than the thickness D6 (FIG. 1J-1) of the first superlattice structure 126 along the bottom surface 124B of the cavity 124. The light absorption material 132, formed in the remainder of the cavity 124, is nested within the first superlattice structure 126, in accordance with some embodiments.

Figure 3A:
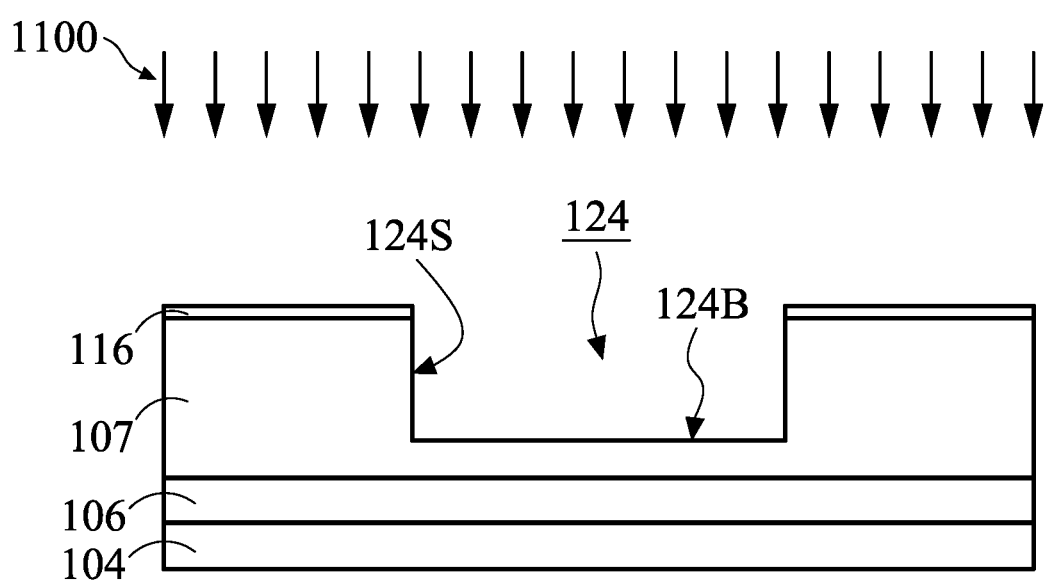
FIGS. 3A through 3C are cross-sectional views illustrating the formation of a photodetector at various intermediate stages, in accordance with some embodiments of the disclosure.
Figure 3B:
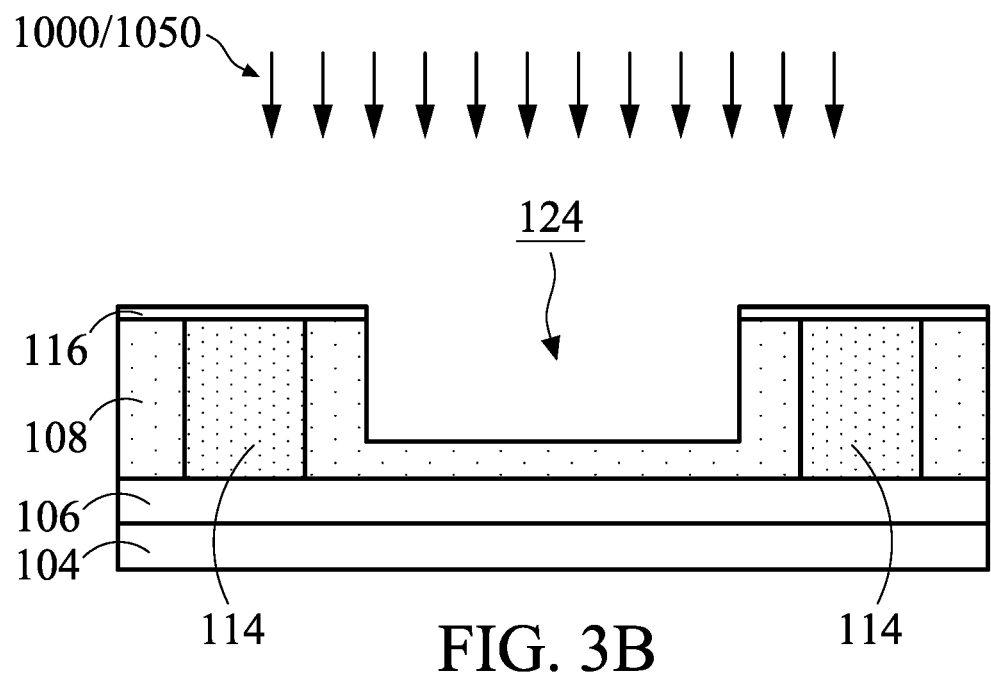
Figure 3C:
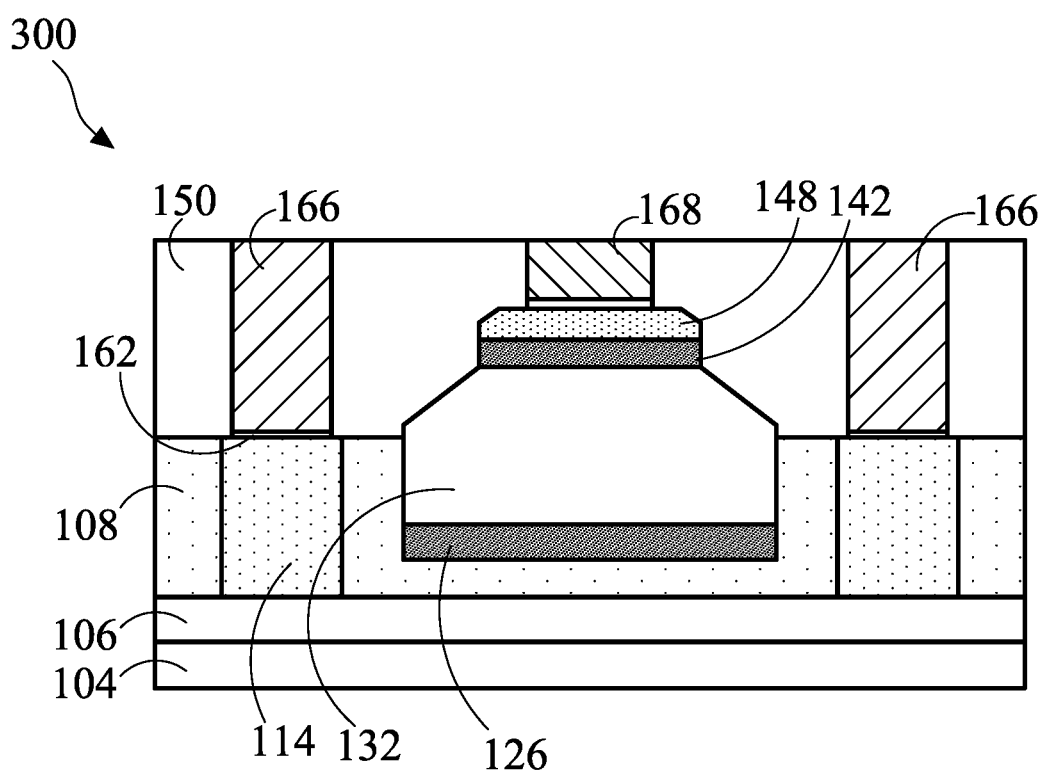

FIGS. 3A through 3C are cross-sectional views illustrating the formation of a photodetector 300 at various intermediate stages, in accordance with some embodiments of the disclosure. The method of forming the photodetector 300 is similar to the method of forming the photodetector 100 except that the ion implantation process 1000 and the ion implantation process 1050 are performed after the formation of the cavity 124.

A substrate 102 is provided, and the steps described above with respect to FIGS. 1E through 1H are performed, thereby forming a cavity 124 in the semiconductor layer 107, as shown in FIG. 3A, in accordance with some embodiments. A smooth process 1100 described above with respect to FIG. 1I is then performed to reduce the roughness of the sidewalls 124S and the bottom surface 124B of the cavity 124, in accordance with some embodiments.

The ion implantation process 1000 described above with respect to FIG. 1B is blanket performed on the structure of FIG. 3A, thereby forming a doped semiconductor layer 108, as shown in FIG. 3B, in accordance with some embodiments. A patterned mask layer (not shown) is formed over the upper surface of the semiconductor layer 108 and an ion implantation process 1050 described above with respect to FIG. 1D is performed, thereby forming first (or bottom) electrode regions 114 on the opposite sides of the cavity 124, in accordance with some embodiments.

The steps described above with respect to FIGS. 1J-1V are performed on the structure of FIG. 3B, thereby producing a photodetector 300, as shown in FIG. 3C, in accordance with some embodiments. Because the doped semiconductor layer 108 and the first electrode regions 114 are formed after the smoothing process 1100 including a high-temperature oxidation process, the diffusion of the dopants from the heavily-doped first electrode regions 114 to the lightly-doped semiconductor layer 108 may be mitigated or prevented, which in turn allows the semiconductor layer 108 maintaining lightly doped. As a result, the performance of the photodetector 300 (e.g., responsivity) may be enhanced because light loss to the heavily doped regions is significantly minimized.

Figure 4:
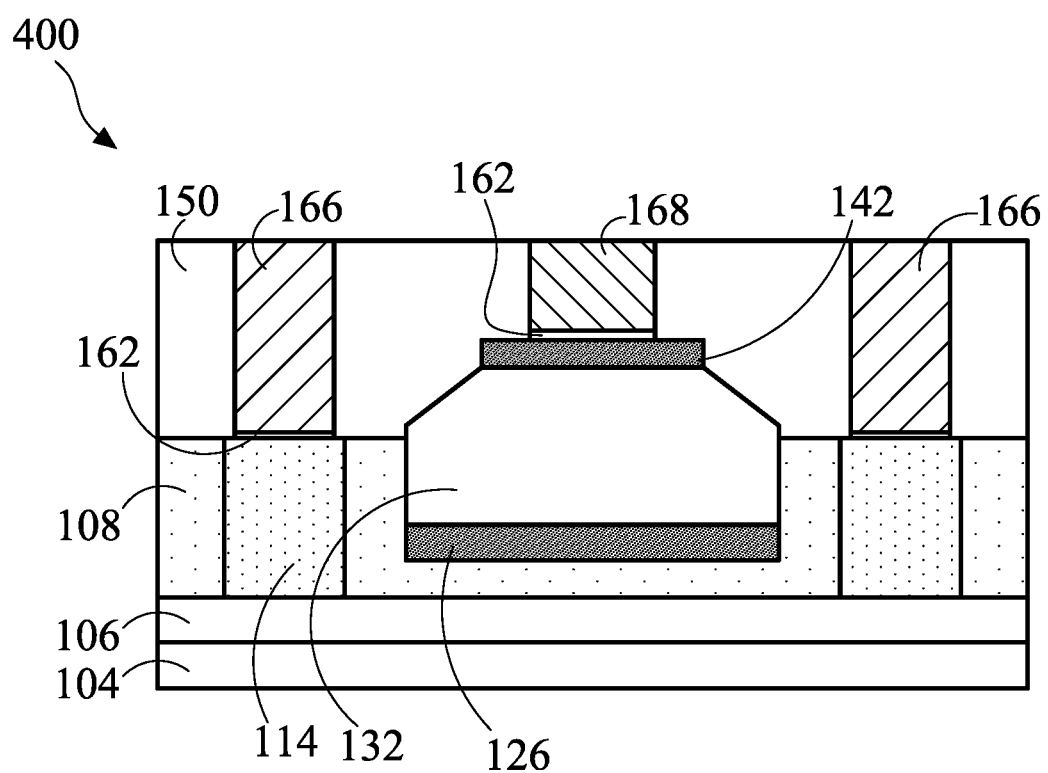
FIG. 4 is a modification of the cross-sectional view of FIG. 1V, in accordance with some embodiments.

FIG. 4 is a modification of the cross-sectional view of FIG. 1V in accordance with some embodiments. FIG. 4 shows a photodetector 400 which is similar to the photodetector 100 of FIG. 1V except that the second electrode region is not formed.

The steps of forming the second electrode region 148 as described in FIG. 1P are omitted, in accordance with some embodiments. The silicide layer 162 is formed on the second superlattice structure 142, as shown in FIG. 4, in accordance with some embodiments. The contact opening 160 (FIG. 1T) passes through the dielectric layer 150 and exposes the top-level silicon germanium layer $146_m$ of the second superlattice structure 142, in accordance with some embodiments. The metal material for the silicide layer 162 is formed on the second superlattice structure 142 and reacts with the top-level silicon germanium layer $146_m$ of the second superlattice structure 142, thereby forming the silicide layer 162, in accordance with some embodiments.

Figure 5A:
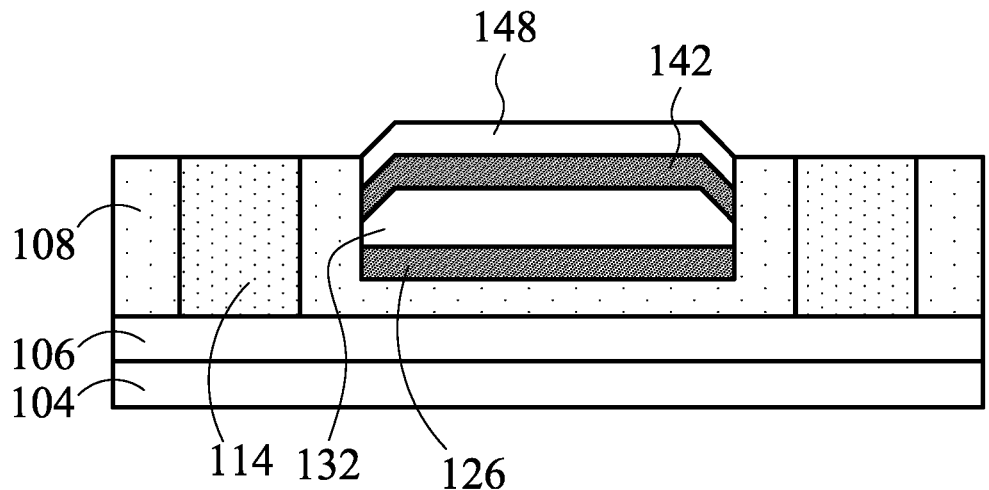
FIGS. 5A and 5B are cross-sectional views illustrating the formation of a photodetector at various intermediate stages, in accordance with some embodiments of the disclosure.
Figure 5B:
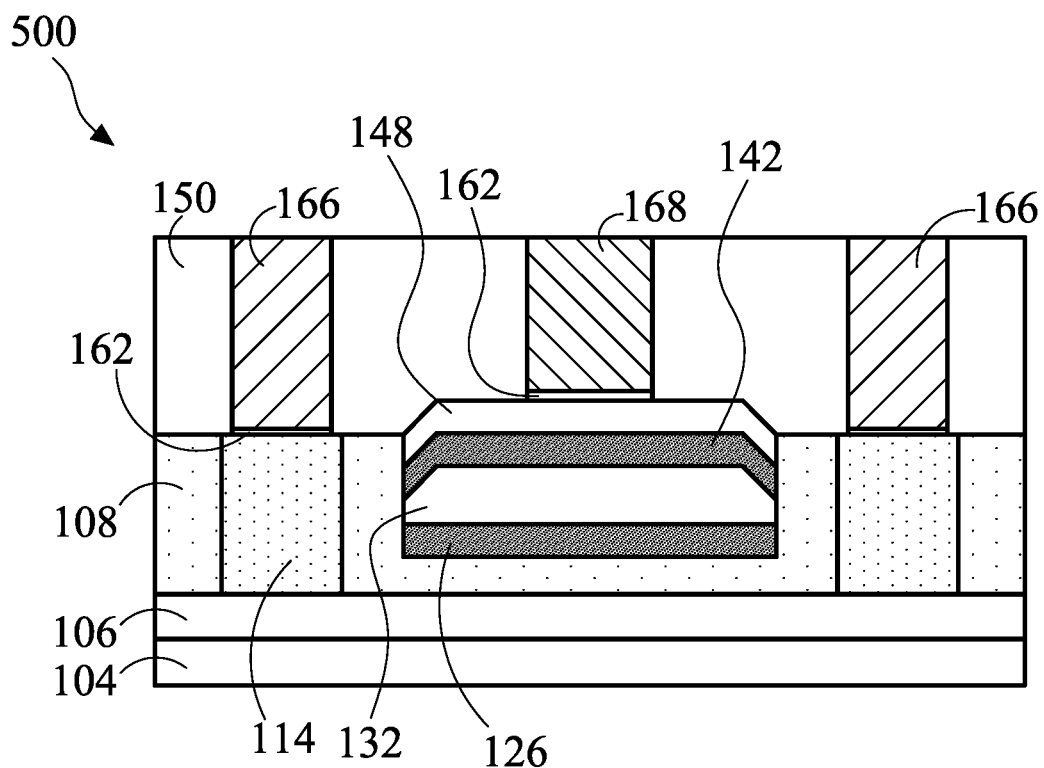

FIGS. 5A and 5B are cross-sectional views illustrating the formation of a photodetector 500 at various intermediate stages, in accordance with some embodiments of the disclosure. The method of forming the photodetector 500 is similar to the method of forming the photodetector 100 except that the first superlattice structure 126, the light absorption material 132, the second superlattice structure 142 and the second electrode region 148 are formed in the cavity 124.

The light absorption material 132 is formed not protruding the cavity 124, as shown in FIG. 5A, in accordance with some embodiments. That is, the upper surface of the light absorption material 132 is lower than the upper surface of the semiconductor layer 108, in accordance with some embodiments. The second superlattice structure 142 and the second electrode region 148 are subsequently formed from a remainder of the cavity 124, in accordance with some embodiments. In some embodiments, the second electrode region 148 is formed protruding above the cavity 124. The sidewalls of the first superlattice structure 126, the light absorption material 132, the second superlattice structure 142 and the second electrode region 148 share a continuous surface (i.e., the sidewall of the cavity 124), in accordance with some embodiments.

After the formation of the second electrode region 148, the protection layer 116 may be removed. The steps described in FIGS. 1R-1V are performed on the structure of FIG. 5A, thereby producing a photodetector 500, as shown in FIG. 5B, in accordance with some embodiments.

Figure 6A:
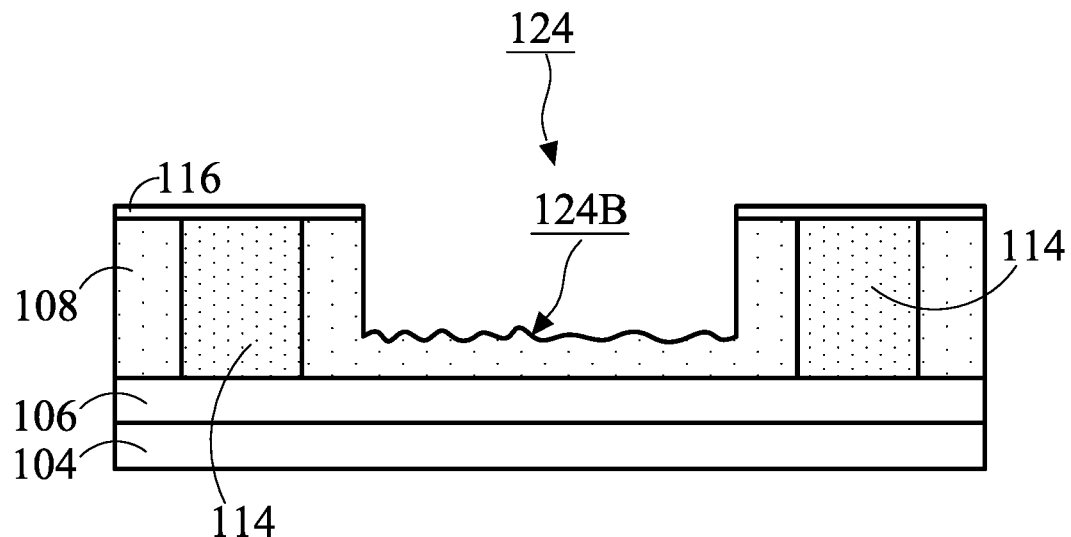
FIGS. 6A through 6G are cross-sectional views illustrating the formation of a photodetector at various intermediate stages, in accordance with some embodiments of the disclosure.

Many variations and/or modifications can be made to embodiments of the disclosure. FIGS. 6A through 6G are cross-sectional views illustrating the formation of a photodetector 600 at various intermediate stages, in accordance with some embodiments. As shown in FIG. 6A, similar to the embodiments illustrated in FIG. 1H, a cavity 124 is formed, in accordance with some embodiments.

Figure 6B:
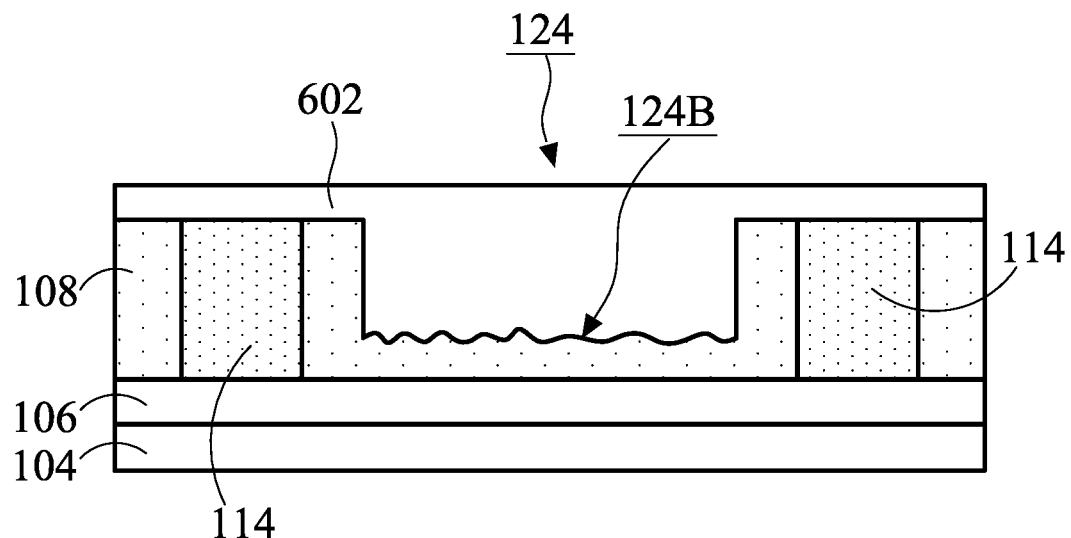

A dielectric layer 602 is formed over the structure of FIG. 6A to fill the cavity 124, as shown in FIG. 6B, in accordance with some embodiments. In some embodiments, the dielectric layer 602 is made of silicon oxide, silicon nitride, silicon oxynitride, and/or another suitable dielectric material. In some embodiments, the dielectric layer 602 is deposited using CVD such as LPCVD, PECVD, or other deposition techniques. Afterward, a planarization process may be performed on the dielectric layer 602.

Figure 6C:
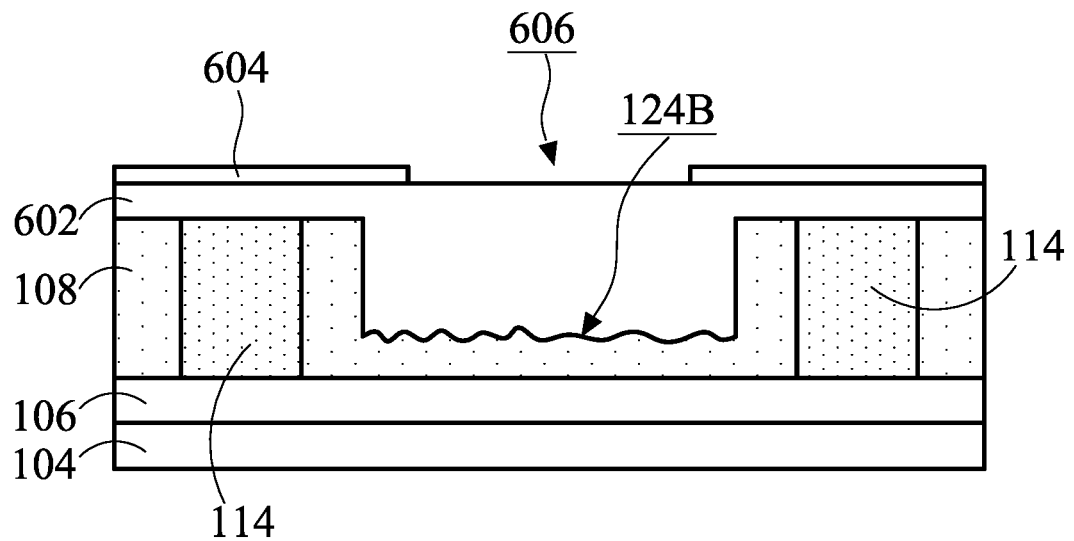

A patterned mask layer 604 is formed over the upper surface of the dielectric layer 602, as shown in FIG. 6C, in accordance with some embodiments. In some embodiments, the patterned mask layer 604 is a patterned hard mask layer. The patterned mask layer 604 has an opening pattern 606 exposing the upper surface of the dielectric layer 602, in accordance with some embodiments. The opening pattern 606 corresponds to the cavity 124, in accordance with some embodiments. The patterned mask layer 604 may be formed using similar steps for forming the patterned mask layer as described above.

Figure 6D:
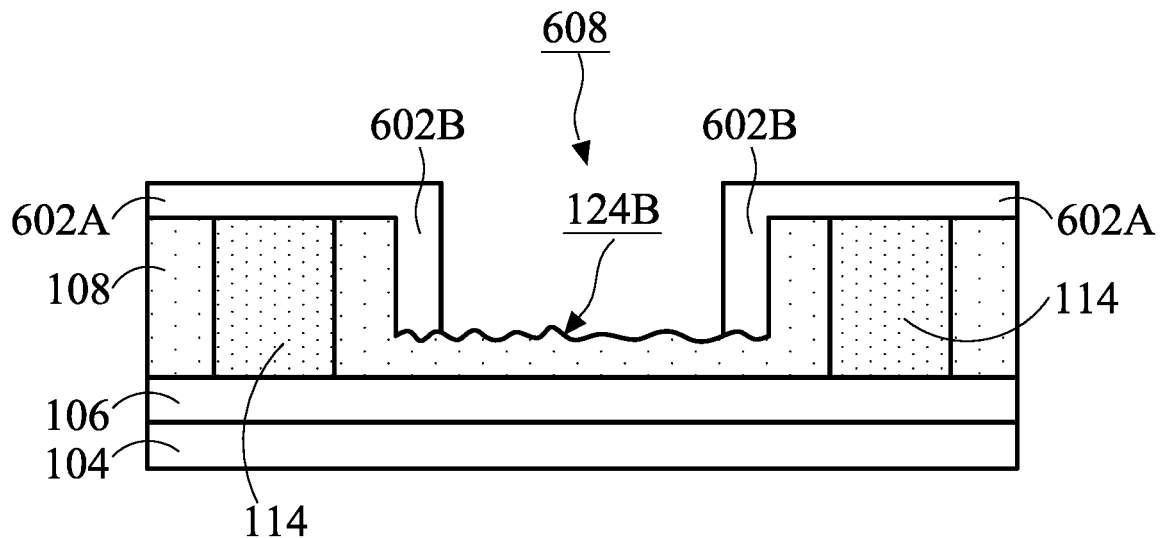

An etching process is performed on the structure of FIG. 6C to transfer the opening pattern 606 into the dielectric layer 602, in accordance with some embodiments. A portion of the dielectric layer 602 exposed from the opening pattern 606 is removed until the semiconductor layer 108 is exposed, thereby forming a cavity 608 within the original cavity 124, as shown in FIG. 6D, in accordance with some embodiments.

A remainder of the dielectric layer 602 includes a horizontal portion 602A over the upper surface of the semiconductor layer 108 and vertical portions 602B covering the sidewalls of the original cavity 124 and defining the cavity 608, in accordance with some embodiments. The bottom surface of the cavity 608 is also denoted as 124B. After the etching process, the patterned mask layer 604 is removed, in accordance with some embodiments.

Optionally, the smoothing process 1100 described above with respect to FIG. 1I may be performed to reduce the roughness of the bottom surface 124B of the cavity 608.

Figure 6E:
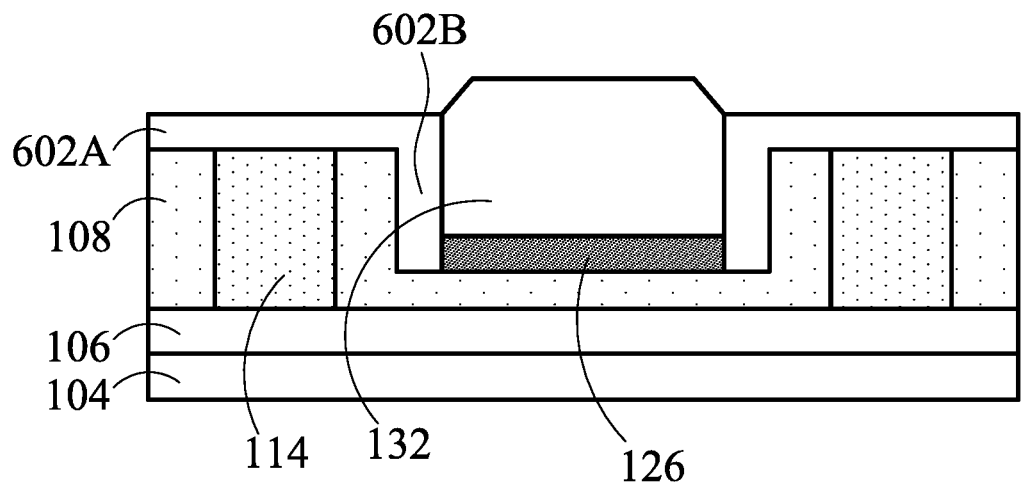

The steps described above with respect to FIGS. 1J and 1K are performed, thereby forming the first superlattice structure 126 and the light absorption material 132 from the cavity 608, as shown in FIG. 6E, in accordance with some embodiments.

Figure 6F:
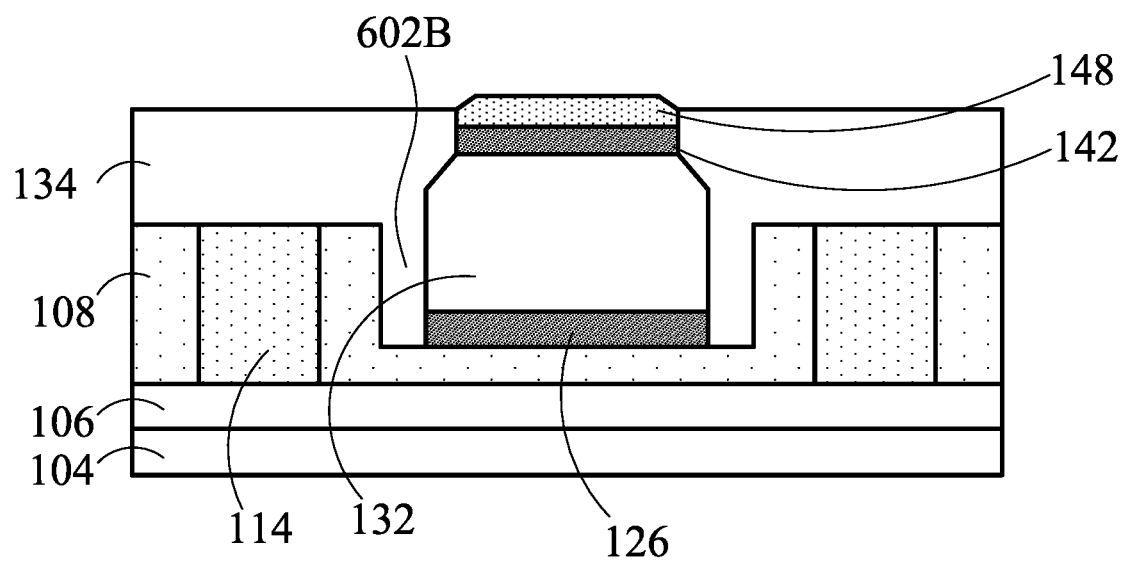

The steps described above with respect to FIGS. 1L through 1P are performed, thereby forming the protection layer 134, the second superlattice structure 142, and the second electrode region 148, as shown in FIG. 6F, in accordance with some embodiments. In some embodiments, the dielectric layer 602 is made of the same material as the protection layer 134, and no interface exists between the horizontal portion 602A of the dielectric layer 602 and the protection layer 134. In some embodiments, the horizontal portion 602A of the dielectric layer 602 may be removed before the protection layer 134 is formed.

Figure 6G:
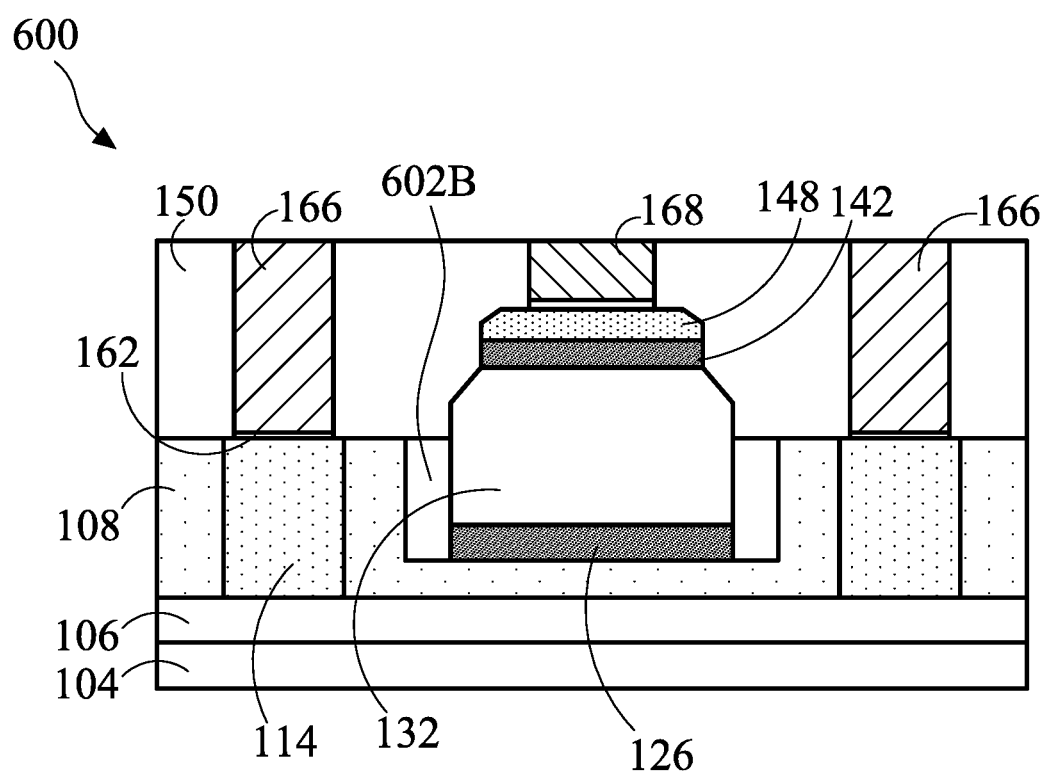

The steps described above with respect to FIGS. 1Q through 1V are performed, thereby forming a photodetector 600, as shown in FIG. 6G, in accordance with some embodiments.

As described above, the embodiments of the present disclosure provide a photodetector including a semiconductor layer 108, a first superlattice structure 126 in the semiconductor layer 108, and a light absorption material 132 above the first superlattice structure 126. The first superlattice structure 126 includes pairs of silicon layer 128/silicon germanium layer 130, which may mitigate or eliminate misfit dislocations between silicon from the semiconductor layer 108 and germanium from the light absorption material 132, thereby reducing the likelihood of the formation of crystalline defects in the light absorption material 132. Therefore, the performance of the photodetector may be enhanced, e.g., lower dark current, lower signal-to-noise ratios, and/or higher responsivity.

Embodiments of a photodetector may be provided. The photodetector may include a first superlattice structure between the semiconductor layer and the light absorption material. Therefore, the performance of the photodetector may be enhanced, e.g., lower dark current, lower signal-to-noise ratios, and/or higher responsivity.

In some embodiments, a photodetector is provided. The photodetector includes a bottom electrode region in a semiconductor layer, a light absorption material in the semiconductor layer, and a first buffer layer sandwiched between a bottom surface of the light absorption material and the semiconductor layer. The first buffer layer includes, from bottom to top, a first Si layer, a first SiGe layer, a second Si layer, and a second SiGe layer. A first atomic percentage of Ge in the first SiGe layer is less than a second atomic percentage of Ge in the second SiGe layer. The photodetector further includes a top electrode region over the light absorption material.

In some embodiments, a photodetector is provided. The photodetector includes bottom electrode regions above a buried oxide layer, a semiconductor layer between the bottom electrode regions, a light absorption material at least partially embedded within the semiconductor layer, and a first buffer layer above the light absorption material. The first buffer layer comprises alternatingly stacking Ge layers and first SiGe layers. The photodetector further includes a top electrode region above the first buffer layer.

In some embodiments, a method for forming a photodetector is provided. The method includes forming a bottom electrode region in a semiconductor layer, etching a semiconductor layer to form a first cavity, forming a light absorption material in the first cavity, and forming a buffer layer over the light absorption material. Forming the buffer layer includes repeating steps of delivering a germanium-containing precursor to grow a Ge layer, and delivering a silicon-containing precursor and the germanium-containing precursor to grow a SiGe layer. The method further includes forming a top electrode region over the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetector, comprising:
    a bottom electrode region in a semiconductor layer;
    a light absorption material in the semiconductor layer;
    a first buffer layer sandwiched between a bottom surface of the light absorption material and the semiconductor layer, wherein the first buffer layer comprises, from bottom to top, a first Si layer, a first SiGe layer, a second Si layer, and a second SiGe layer, and a first atomic percentage of Ge in the first SiGe layer is less than a second atomic percentage of Ge in the second SiGe layer; and
    a top electrode region over the light absorption material.

2. The photodetector as claimed in claim 1, further comprising:
    a buried oxide layer below the semiconductor layer, wherein the bottom electrode region is in contact with the buried oxide layer.

3. The photodetector as claimed in claim 1, wherein the first buffer layer further comprises a third Si layer over the second SiGe layer and a third SiGe layer over the third Si layer, wherein the second atomic percentage of Ge in the second SiGe layer is less than a third atomic percentage of Ge in the third SiGe layer.

4. The photodetector as claimed in claim 3, wherein the first Si layer is thicker than the second Si layer and the third Si layer.

5. The photodetector as claimed in claim 1, wherein a ratio of a thickness of the first buffer layer to a thickness of the light absorption material is in a range from about 0.1 to about 0.3.

6. The photodetector as claimed in claim 1, wherein the first buffer layer and the semiconductor layer are doped with an n-type dopant.

7. The photodetector as claimed in claim 6, wherein a first concentration of the n-type dopant in the first buffer layer is less than a second concentration of the n-type dopant in the semiconductor layer.

8. The photodetector as claimed in claim 1, wherein the top electrode region comprises, from bottom to top, a first Ge layer, a third SiGe layer, a second Ge layer, and a fourth SiGe layer, and a third atomic percentage of Ge in the third SiGe layer is greater than a fourth atomic percentage of Ge in the fourth SiGe layer.

9. The photodetector as claimed in claim 1, wherein a sidewall of the light absorption material and a sidewall of the first buffer layer share a continuous surface.

10. The photodetector as claimed in claim 1, further comprising:
a dielectric layer sandwiched between a sidewall of the first buffer layer and the semiconductor layer and between a sidewall of the light absorption material and the semiconductor layer.

11. A photodetector, comprising:
bottom electrode regions above a buried oxide layer;
a semiconductor layer between the bottom electrode regions;
a light absorption material at least partially embedded within the semiconductor layer;
a first buffer layer above the light absorption material, wherein the first buffer layer comprises alternatingly stacking Ge layers and first SiGe layers; and
a top electrode region above the first buffer layer.

12. The photodetector as claimed in claim 11, wherein the light absorption material is made of Ge, and the top electrode region is made of Si doped with a p-type dopant.

13. The photodetector as claimed in claim 11, wherein atomic percentages of Ge in the SiGe layers of the first buffer layer decrease in order as the level of the SiGe layer increases from the light absorption material to the top electrode region.

14. The photodetector as claimed in claim 11, further comprising:
a second buffer layer between the light absorption material and the semiconductor layer, wherein the second buffer layer comprises alternatingly stacking Si layers and SiGe layers.

15. The photodetector as claimed in claim 11, wherein a top surface of the light absorption material is lower than a top surface of the semiconductor layer.

16. The photodetector as claimed in claim 15, wherein a sidewall of the first buffer layer is interfaced with a surface of the semiconductor layer.

17. A method for forming a photodetector, comprising:
forming a bottom electrode region in a semiconductor layer;
etching a semiconductor layer to form a first cavity;
forming a light absorption material in the first cavity;
forming a buffer layer over the light absorption material, wherein the forming the buffer layer comprises repeating steps of:
delivering a germanium-containing precursor to grow a Ge layer; and
delivering a silicon-containing precursor and the germanium-containing precursor to grow a SiGe layer; and
forming a top electrode region over the buffer layer.

18. The method for forming the photodetector as claimed in claim 17, further comprising:
forming a protection layer to cover the semiconductor layer and the light absorption material; and
forming a second cavity through the protection layer until the light absorption material is exposed, wherein the buffer layer and the top electrode region are formed in the second cavity.

19. The method for forming the photodetector as claimed in claim 17, wherein the buffer layer and the top electrode region are formed in the first cavity.

20. The method for forming the photodetector as claimed in claim 17, further comprising:
forming a dielectric layer to cover a top surface of the semiconductor layer and side surfaces of the semiconductor layer exposed from the first cavity before forming the light absorption material.

* * * * *